(12) United States Patent
Nakane

(10) Patent No.: US 11,397,047 B2
(45) Date of Patent: Jul. 26, 2022

(54) MOISTURE DETECTOR, MOISTURE DETECTION METHOD, ELECTRONIC DEVICE, AND LOG OUTPUT SYSTEM

(71) Applicant: MINEBEA MITSUMI Inc., Nagano (JP)

(72) Inventor: Taketomo Nakane, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 288 days.

(21) Appl. No.: 16/794,631

(22) Filed: Feb. 19, 2020

(65) Prior Publication Data

US 2020/0326123 A1    Oct. 15, 2020

(30) Foreign Application Priority Data

Apr. 10, 2019  (JP) .............................. JP2019-074737
Dec. 13, 2019  (JP) .............................. JP2019-225748

(51) Int. Cl.

| | |
|---|---|
| F25D 29/00 | (2006.01) |
| F25D 17/04 | (2006.01) |
| G01N 27/22 | (2006.01) |
| G01K 17/02 | (2006.01) |
| G01N 25/56 | (2006.01) |
| B81B 7/00 | (2006.01) |
| G01N 25/60 | (2006.01) |

(Continued)

(52) U.S. Cl.
CPC .......... F25D 29/006 (2013.01); B81B 7/008 (2013.01); F25D 17/042 (2013.01); F25D 29/008 (2013.01); G01K 17/025 (2013.01); G01N 25/56 (2013.01); G01N 25/60 (2013.01); G01N 25/68 (2013.01); G01N 27/223 (2013.01); G01P 15/08 (2013.01); G01P 15/125 (2013.01); G01P 15/131 (2013.01); B81B 2201/02 (2013.01); B81B 2207/03 (2013.01)

(58) Field of Classification Search
CPC ...... G01N 27/223; G01N 25/56; G01N 25/60; G01N 25/68; G05D 22/02; B81B 7/008; B81B 2201/02; B81B 2207/03; G01P 15/08; G01P 15/125; G01P 15/131
USPC ........................................................ 73/29.01
See application file for complete search history.

(56) References Cited

U.S. PATENT DOCUMENTS 4,224,565 A * 9/1980 Sosniak ................. G01N 25/68
                                                              324/687
4,597,285 A * 7/1986 Kuchar ...................... F15C 1/22
                                                                73/1.06

(Continued)

FOREIGN PATENT DOCUMENTS

| JP | H10-320902 | 12/1998 | | |
|---|---|---|---|---|
| JP | H10320902 | * 12/1998 | ............. | G11B 19/04 |

(Continued)

*Primary Examiner* — Clayton E. LaBalle
*Assistant Examiner* — Kevin C Butler
(74) *Attorney, Agent, or Firm* — IPUSA, PLLC

(57) ABSTRACT

A moisture detector includes a sensor chip and a moisture determining unit. The sensor chip includes a humidity detector having a detection surface on which to measure humidity, and also includes a heater heating the detection surface, and the moisture determining unit is configured to, after causing the heater to start heating, determine whether moisture is present on the detection surface based on a difference in changes in the humidity measured by the humidity detector.

15 Claims, 37 Drawing Sheets

(51) Int. Cl.
*G01N 25/68* (2006.01)
*G01P 15/125* (2006.01)
*G01P 15/08* (2006.01)
*G01P 15/13* (2006.01)

(56) References Cited

U.S. PATENT DOCUMENTS

| | | | | |
|---|---|---|---|---|
| 4,975,249 A * | 12/1990 | Elliott | | G01N 21/81 |
| | | | | 252/963 |
| 5,048,336 A * | 9/1991 | Sugihara | | G01N 27/18 |
| | | | | 73/29.01 |
| 5,837,884 A * | 11/1998 | Kimura | | G01N 27/18 |
| | | | | 73/25.04 |
| 6,126,311 A * | 10/2000 | Schuh | | G01N 5/025 |
| | | | | 374/118 |
| 6,335,843 B2 | 1/2002 | Yotsuya et al. | | |
| 6,540,963 B2 * | 4/2003 | Sugiyama | | G01N 27/225 |
| | | | | 422/110 |
| 7,393,135 B2 * | 7/2008 | Kanai | | G01N 21/4738 |
| | | | | 374/19 |
| 7,640,798 B2 * | 1/2010 | Oda | | G01F 1/6845 |
| | | | | 73/204.26 |
| 8,007,167 B2 * | 8/2011 | Cummins | | G01N 27/223 |
| | | | | 374/16 |
| 10,502,702 B2 * | 12/2019 | Hong | | G01N 27/223 |
| 2002/0005068 A1 * | 1/2002 | Libbrecht | | G01N 25/68 |
| | | | | 73/335.04 |
| 2005/0218465 A1 * | 10/2005 | Cummins | | G01N 27/223 |
| | | | | 257/414 |
| 2005/0220166 A1 * | 10/2005 | Kanai | | G01N 25/68 |
| | | | | 374/16 |
| 2006/0145879 A1 * | 7/2006 | Stackelhouse | | G01N 25/56 |
| | | | | 340/604 |
| 2006/0196206 A1 * | 9/2006 | Murray | | F25D 21/04 |
| | | | | 62/248 |
| 2007/0113644 A1 * | 5/2007 | Manaka | | G01N 25/66 |
| | | | | 73/204.26 |
| 2007/0171955 A1 * | 7/2007 | Kanai | | G01N 25/68 |
| | | | | 374/28 |
| 2007/0211781 A1 * | 9/2007 | Kanai | | G01N 25/68 |
| | | | | 374/20 |
| 2011/0226041 A1 * | 9/2011 | Cummins | | H01L 23/64 |
| | | | | 73/25.01 |
| 2012/0053872 A1 * | 3/2012 | Felnhofer | | G01N 27/223 |
| | | | | 702/64 |
| 2012/0304742 A1 * | 12/2012 | Cummins | | G01N 27/121 |
| | | | | 73/31.06 |
| 2013/0024169 A1 * | 1/2013 | Veerasamy | | G01J 1/42 |
| | | | | 703/2 |
| 2016/0003758 A1 * | 1/2016 | Hong | | G01N 27/223 |
| | | | | 324/664 |
| 2017/0140990 A1 * | 5/2017 | Saxena | | H01L 23/3171 |
| 2018/0164236 A1 * | 6/2018 | Tao | | G01N 21/41 |
| 2020/0041431 A1 * | 2/2020 | Herman | | G01N 25/68 |
| 2020/0158673 A1 * | 5/2020 | Nakane | | H01L 23/49513 |
| 2020/0158674 A1 * | 5/2020 | Nakane | | G01N 27/223 |
| 2020/0300797 A1 * | 9/2020 | Wakana | | G01N 33/4972 |
| 2020/0326123 A1 * | 10/2020 | Nakane | | F25D 29/005 |
| 2021/0144802 A1 * | 5/2021 | Zafar | | A01G 22/00 |
| 2021/0181136 A1 * | 6/2021 | Miyatake | | H01L 23/3185 |
| 2021/0349045 A1 * | 11/2021 | Choi | | G01K 7/02 |

FOREIGN PATENT DOCUMENTS

| | | | | |
|---|---|---|---|---|
| JP | 11-002617 | * | 1/1999 | G01N 27/04 |
| JP | H11-002617 | | 1/1999 | |
| JP | 2006234576 | * | 9/2006 | G01N 27/22 |
| JP | 2014-122757 | | 7/2014 | |
| JP | 2014122757 | * | 7/2014 | F25D 17/06 |
| JP | 2016-200657 | | 12/2016 | |
| JP | 2016200657 | * | 12/2016 | G03B 21/16 |

* cited by examiner

FIG.24

| AMOUNT OF CONDENSATION | T(0) | T(t), t = 10 sec | Y |
|---|---|---|---|
| LARGE | 5.5°C | 9.5°C | 0.900 |
| MODERATE | 5.8°C | 12.7°C | 0.101 |
| SMALL (FOGGY) | 6.1°C | 13.3°C | 0.056 |

FIG.37

| DATE AND TIME | TEMPERATURE (°C) | HUMIDITY (% RH) | MOISTURE DETERMINATION RESULT (0 = NEGATIVE, 1 = POSITIVE) |
|---|---|---|---|
| 2019/11/14 0:00 | 26.12 | 37.23 | 0 |
| 2019/11/14 0:10 | 26.11 | 37.23 | 0 |
| 2019/11/14 0:20 | 26.12 | 37.22 | 0 |
| 2019/11/14 0:30 | 26.13 | 37.23 | 0 |
| 2019/11/14 0:40 | 26.12 | 37.23 | 0 |
| 2019/11/14 0:50 | 26.12 | 37.22 | 0 |
| 2019/11/14 1:00 | 26.12 | 37.22 | 0 |
| 2019/11/14 1:10 | 26.13 | 37.23 | 0 |
| ... | ... | ... | ... |

310

MOISTURE DETECTOR, MOISTURE DETECTION METHOD, ELECTRONIC DEVICE, AND LOG OUTPUT SYSTEM

CROSS-REFERENCE TO RELATED APPLICATIONS

This application is based on and claims priority to Japanese Patent Application No. 2019-074737, filed on Apr. 10, 2019, and Japanese Patent Application No. 2019-225748, filed on Dec. 13, 2019, the entire contents of which are incorporated herein by reference.

BACKGROUND OF THE INVENTION

1. Field of the Invention

The disclosures herein relate to a moisture detector, a moisture detection method, an electronic device, and a log output system.

2. Description of the Related Art

In recent years, in order to prevent damage to magnetic heads due to the presence of moisture, some floating-head-type hard disk drives (HDD) are equipped with condensation sensors. In such a HDD equipped with a condensation sensor, it has been proposed that, when condensation is detected by the condensation sensor, a head is temporarily moved and a magnetic disk is rotated until condensation becomes no longer detected (see Patent Document 1).

Further, in recent years, there are projectors having cooling mechanisms. In such a projector, condensation may be caused by the influence of a cooling mechanism, and its water droplets may spread inside a sealed container and adhere to an optical device. In light of the above, a projector including a condensation sensor and a heat exchanger has been proposed, in which the heat exchanger is controlled based on the condensation state detected by the condensation sensor (see Patent Document 2).

Further, in recent years, refrigerators including crisper drawers for vegetable preservation, in addition to refrigerator compartments, have been widely used. In such a refrigerator, a crisper drawer is maintained at a higher temperature than a refrigerator compartment, and is also maintained at a higher humidity than the refrigerator compartment in order to prevent vegetables from drying. Therefore, condensation is likely to occur in the refrigerator, and if condensation occurs, vegetables may be damaged.

In light of the above, a refrigerator including an air supply unit has been proposed, in which the humidity of a crisper drawer is measured by a humidity sensor, and the air supply unit supplies air into the crisper drawer so as to prevent condensation (see Patent Document 3). Further, in Patent Document 3, in order to quickly and accurately detect the condensation state in the crisper drawer, the use of a condensation sensor has also been proposed.

In the above-described documents, the condensation sensors installed in electronic devices such as a HDD, a projector, and a refrigerator have been described. Further, in Patent Document 3, as the condensation sensor, the use of a high sensitivity condensation sensor formed of a material such as aluminum has been described. However, the above-described documents do not disclose specific configurations of the condensation sensors.

In general, a resistance-type condensation sensor is used to detect condensation (see Patent Document 4). For detection of frost, a resistance-type frost sensor is used. Further, an optical dew point meter is used to measure the dew point and the frost point.

It is desirable for condensation sensors and frost sensors installed in electronic devices such as HDDs, projectors, or refrigerators as described above to be able to quickly and accurately detect condensation and frost, and also to be small and inexpensive.

However, for example, although resistance-type condensation sensors and frost sensors are inexpensive, detection accuracy may decrease as the number of detection times of condensation and frost increases. Further, because optical components such as lasers and photodetectors are used in optical dew point meters, the optical dew point meters are expensive, and the size reduction of the optical dew point meters is also difficult. For this reason, the resistance-type condensation sensors, the resistance-type frost sensors, and the optical dew-point meters are not suitable to be installed on electronic devices as described above.

Further, condensation sensors installed in bathrooms have also problems as described above.

RELATED-ART DOCUMENTS

Patent Documents

Patent Document 1: Japanese Laid-open Patent Publication No. 10-320902
Patent Document 2: Japanese Laid-open Patent Publication No. 2016-200657
Patent Document 3: Japanese Laid-open Patent Publication No. 2014-122757
Patent Document 4: Japanese Laid-open Patent Publication No. 11-002617

SUMMARY OF THE INVENTION

It is a general object of the present invention to provide a small and inexpensive moisture detector that quickly and accurately detects the presence of moisture such as condensation and frost.

According to an embodiment of the present invention, a moisture detector includes a sensor chip and a moisture determining unit. The sensor chip includes a humidity detector having a detection surface on which to measure humidity, and also includes a heater heating the detection surface, and the moisture determining unit is configured to, after causing the heater to start heating, determine whether moisture is present on the detection surface based on a difference in changes in the humidity measured by the humidity detector.

BRIEF DESCRIPTION OF THE DRAWINGS

Other objects and further features of the present invention will be apparent from the following detailed description when read in conjunction with the accompanying drawings, in which:

FIG. 24 is a table illustrating the relationship between the amount of condensation and a temperature change coefficient;

FIG. 37 is a table illustrating log output data according to the third embodiment.

DESCRIPTION OF THE EMBODIMENTS

Figure 1:
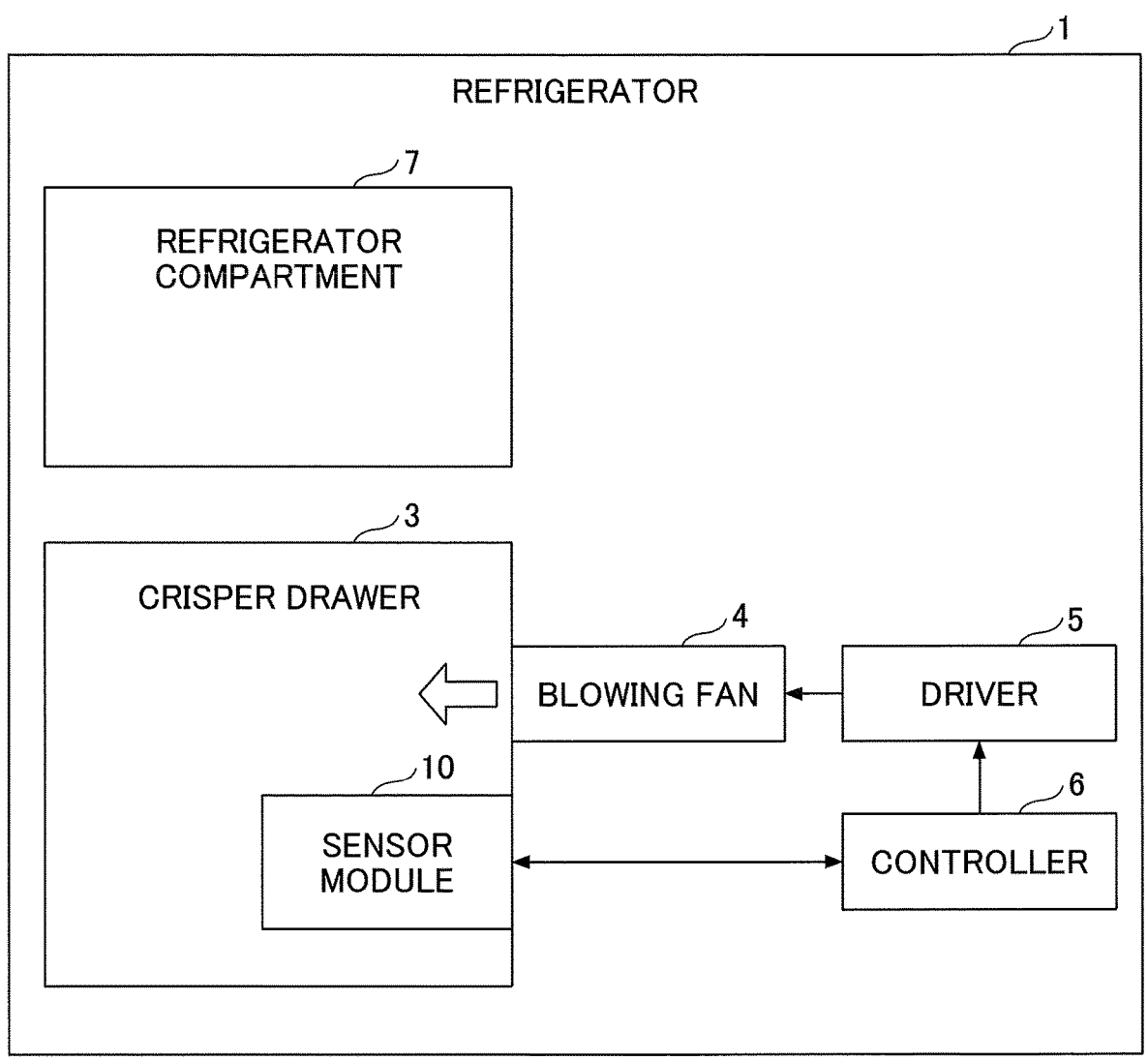
FIG. 1 is a schematic view of the overall configuration of a refrigerator according to a first embodiment of the present invention.

According to an embodiment of the present invention, it is possible to provide a small and inexpensive moisture detector that quickly and accurately detects the presence of moisture such as condensation and frost.

In the following, embodiments of the present invention will be described with reference to the accompanying drawings. In the drawings, the same elements are denoted by the same reference numerals, and a duplicate description thereof may be omitted. As used herein, "humidity" refers to "relative humidity".

First Embodiment

[Overall Configuration]

An example in which a moisture sensor according to an embodiment of the present invention is installed in a refrigerator, which is an example of an electronic device, including a crisper drawer will be described.

FIG. 1 is a schematic view of the overall configuration of a refrigerator according to a first embodiment of the present invention. As illustrated in FIG. 1, a refrigerator 1 includes a refrigerator compartment 7 and a crisper drawer 3. Although not illustrated, a cooler and a compressor are provided in the refrigerator 1, and the refrigerator compartment 7 is cooled by heat exchange. The crisper drawer 3 is cooled by cold air flowing from the refrigerator compartment 7. The temperature of the crisper drawer 3 is set to be higher than that of the refrigerator compartment 7. For example, the temperature of the refrigerator compartment 7 is maintained at approximately 3° C., and the temperature of the crisper drawer 3 is maintained at approximately 5° C. Further, in order to prevent vegetables from drying, the humidity of the crisper drawer 3 is set to be higher than that of the refrigerator compartment 7.

A blowing fan 4 configured to supply dry air into the crisper drawer 3 is coupled to the crisper drawer 3. The blowing fan 4 is driven by a driver 5 to cause air to blow into the crisper drawer 3.

In addition, a sensor module 10 configured to measure humidity and temperature inside the crisper drawer 3 is provided in the crisper drawer 3. A controller 6 is coupled to the sensor module 10 and the driver 5. The controller 6 detects condensation based on measured values obtained from the sensor module 10, and controls the driver 5 to operate the blowing fan 4 in accordance with the condensation detection result. The blowing fan 4 is driven by a driver 5. The blowing fan 4 is an example of a condensation remover that removes condensation inside the crisper drawer 3. The crisper drawer 3 is an example of a sensor accommodating compartment in which the sensor module 10 is installed.

[Configuration of Sensor Module]

Next, a configuration of the sensor module 10 will be described.

Figure 2A:
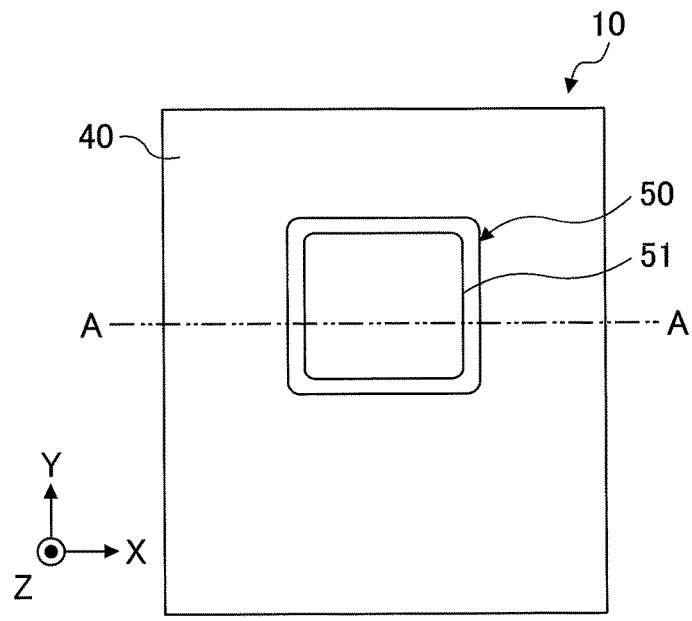
FIG. 2A through FIG. 2C are diagrams illustrating a schematic configuration of a sensor module according to the first embodiment of the present invention.
Figure 2C:
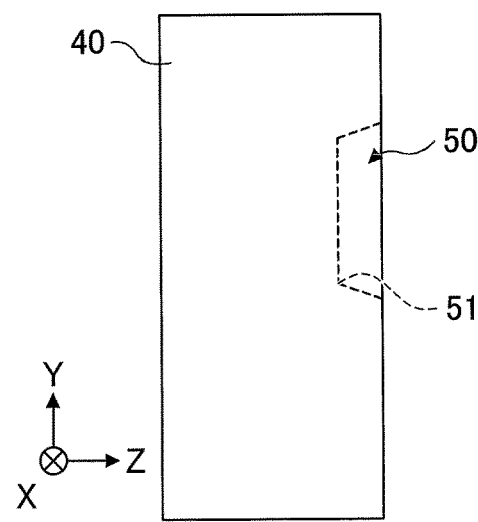
Figure 2B:
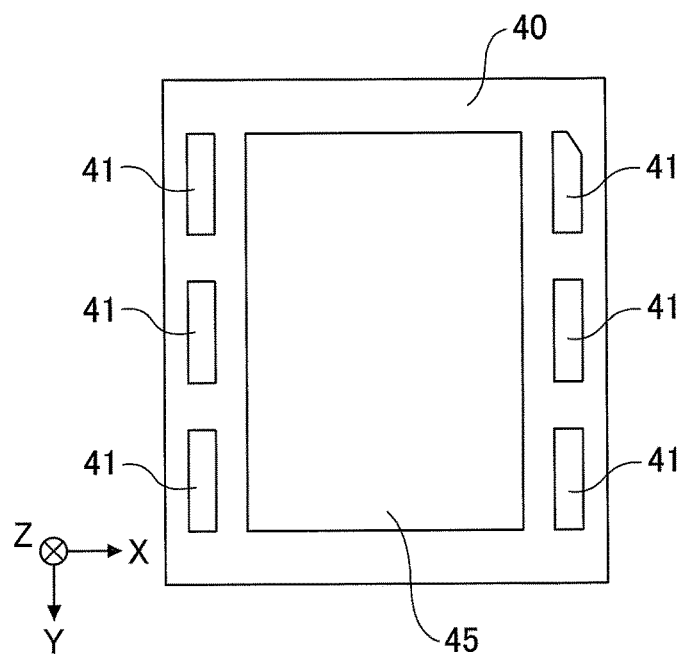
Figure 3:
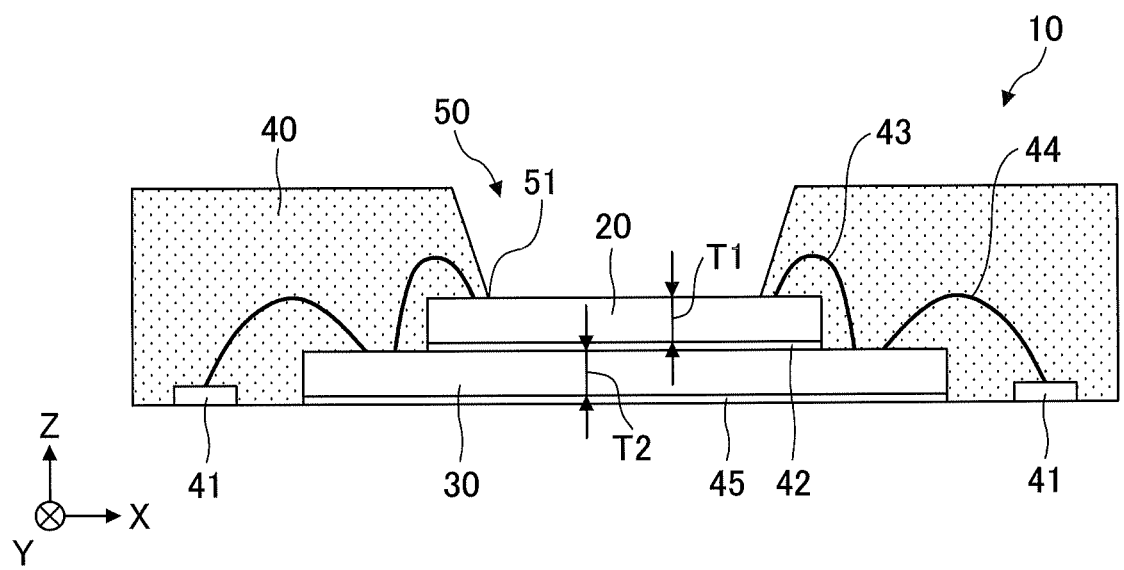
FIG. 3 is a schematic cross-sectional view of the sensor module taken through line A-A of FIG. 2A.

FIG. 2A through FIG. 2C are diagrams illustrating a schematic configuration of the sensor module 10 according to an embodiment of the present invention. FIG. 2A is a plan view from above the sensor module 10. FIG. 2B is a bottom view from below the sensor module 10. FIG. 2C is a side view from the side of the sensor module 10. Further, FIG. 3 is a schematic cross-sectional view of the sensor module 10 taken through line A-A of FIG. 2A.

The sensor module 10 has an approximately rectangular shape in planar view. The X-direction and the Y-direction are perpendicular to each other. The sensor module 10 has a thickness in the Z-direction that is perpendicular to both the X-direction and the Y-direction. The shape of the sensor module 10 in planar view is not limited to the rectangular shape, and may a circular shape, an oval shape, or a polygonal shape.

The sensor module 10 includes a sensor chip 20, which is an example of a first semiconductor chip, an application-specific integrated circuit (ASIC) chip 30, which is an example of a second semiconductor chip, a molded resin 40, and a plurality of lead terminals 41.

The sensor chip 20 is stacked on the ASIC chip 30 via a first die attach film (DAF) 42. In other words, the sensor chip 20 and the ASIC chip 30 have a stacked structure.

The sensor chip 20 and the ASIC chip 30 are electrically connected via a plurality of first bonding wires 43. The ASIC chip 30 and the plurality of leads 41 are electrically connected via a plurality of second bonding wires 44.

The sensor chip 20 and the ASIC chip 30 stacked as descried above, the plurality of first bonding wires 43, the plurality of second bonding wires 44, and the plurality of lead terminals 41 are sealed by the molded resin 40 to form a package. Such a packaging technique is referred to as a plating lead package (PLP) method.

As will be described in more detail below, a second DAF 45, used to form the package with the PLP method, remains on the lower surface of the ASIC chip 30. The second DAF 45 functions to electrically insulate the lower surface of the ASIC chip 30. The second DAF 45 and the plurality of lead terminals 41 are exposed on the lower surface of the sensor module 10.

Each of the lead terminals 41 is formed of nickel or copper, for example. The first DAF 42 and the second DAF 45 are each formed of an insulating material that is a mixture of a resin, silica, and the like. The molded resin 40 is a black resin having light-blocking properties, such as an epoxy resin including a mixture of carbon black, silica, and the like.

An opening 50 is formed on the upper surface side of the sensor module 10, and a part of the sensor chip 20 is exposed from the molded resin 40 through the opening 50. For example, the opening 50 may have a tapered wall, such that the area of the opening decreases toward the lower surface of the sensor module 10. The lowermost part of the opening 50, from which the sensor chip 20 is exposed, is referred to as an effective opening 51.

When the opening 50 is formed, the molded resin 40 is applied while pressing a mold against the sensor chip 20. At this time, the pressing force against the sensor chip 20 and the ASIC chip 30 may cause damage such as cracking of the chip. In order to prevent such damage, the thickness T1 of the sensor chip 20 and the thickness T2 of the ASIC chip 30 are preferably 200 µm or more.

Figure 4:
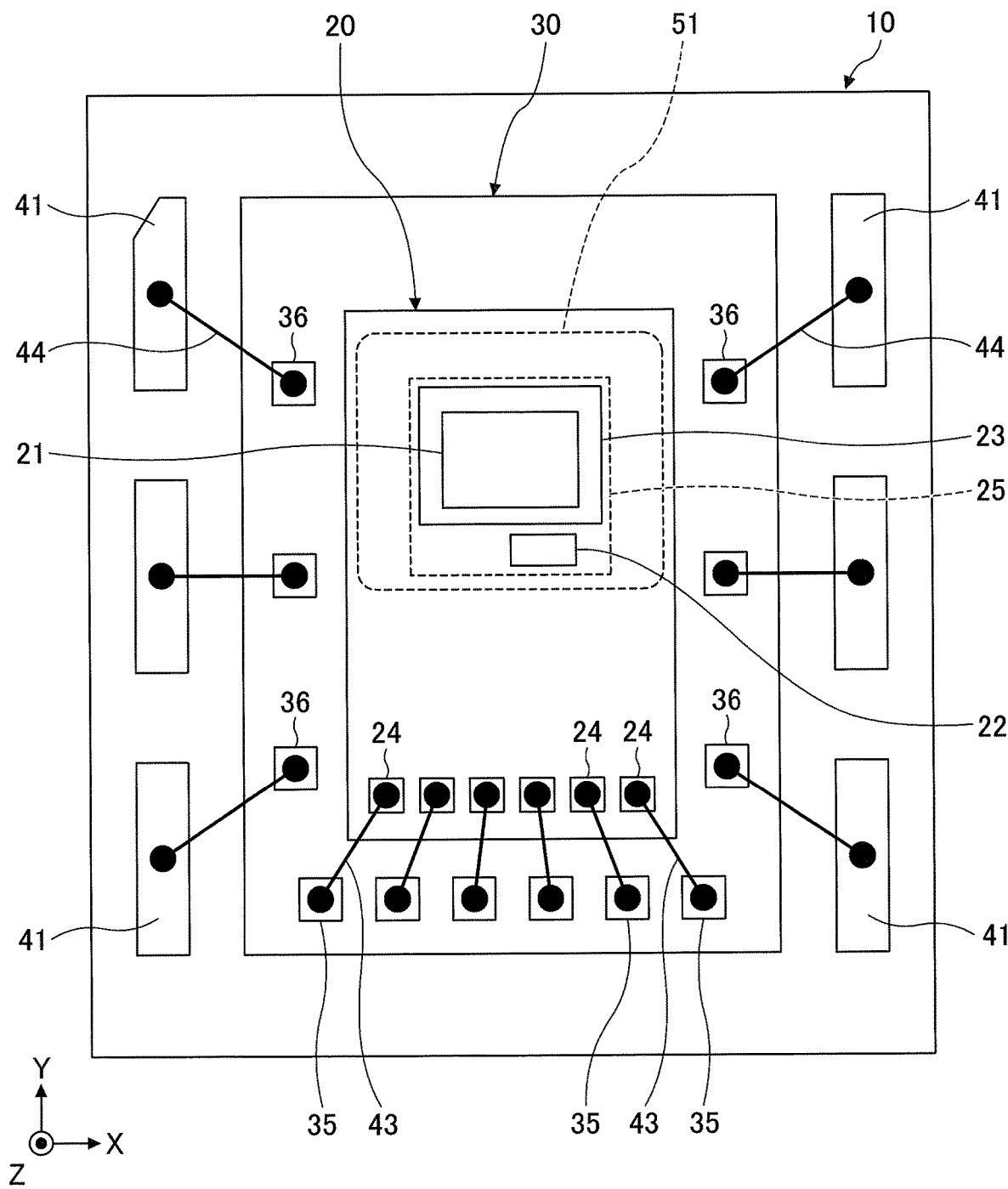
FIG. 4 is a plan view of the sensor module in which a molded resin is not depicted.

FIG. 4 is a plan view of the sensor module 10 in which the molded resin 40 is not depicted. As illustrated in FIG. 4, the sensor chip 20 and the ASIC chip 30 each have an approximately rectangular shape in planar view. The sensor chip 20 is smaller than the ASIC chip 30, and the sensor chip 20 is stacked on the surface of the ASIC chip 30 via the first DAF 42.

The sensor chip 20 includes a humidity detector 21, a temperature detector 22, and a heater 23 within the effective opening 51. The heater 23 is disposed on the lower surface of the humidity detector 21 to cover a region where the humidity detector 21 is formed. In other words, the area of the heater 23 is larger than the area of the humidity detector 21 in the planar view. Accordingly, the molded resin 40, which is an example of a sealing member, seals the sensor chip 20, with the humidity detector 21 and the temperature detector 22 being exposed.

Further, a plurality of bonding pads (hereinafter simply referred to as "pads") 24 are formed at the end portion of the sensor chip 20. In the present embodiment, six pads 24 are formed. The pads 24 may be formed of aluminum or an aluminum silicon (AlSi) alloy, for example.

Figure 13:
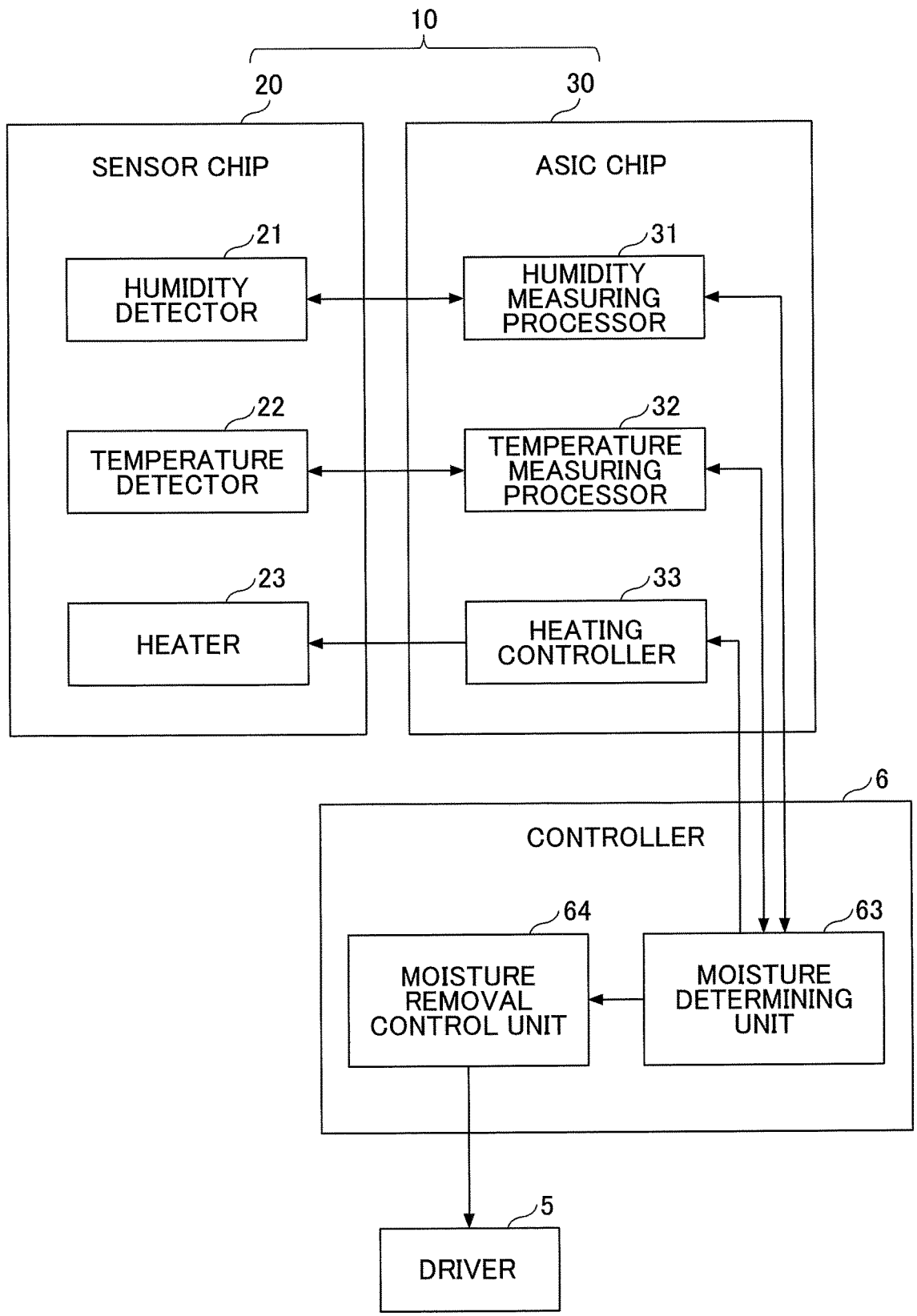
FIG. 13 is a block diagram illustrating a functional configuration of an ASIC chip.

The ASIC chip 30 is a semiconductor chip for signal processing and control. As illustrated in FIG. 13, the ASIC chip 30 includes a humidity measuring processor 31, a temperature measuring processor 32, and a heating controller 33, which will be described below.

Further, a plurality of first pads 35 and a plurality of second pads 36 are provided in an area on the surface of the ASIC chip 30 that is not covered by the sensor chip 20. The first pads 35 and the second pads 36 may be formed of aluminum or an aluminum silicon (AlSi) alloy, for example.

The first pads 35 are connected to the respective pads 24 of the sensor chip 20 via the first bonding wires 43. The second pads 36 are connected to the respective lead terminals 41 via the second bonding wires 44. The lead terminals 41 are disposed at the periphery of the ASIC chip 30.

In the manufacturing process of the sensor module 10, the mounting position of the ASIC chip 30 is determined based on the lead terminals 41. The mounting position of the sensor chip 20 on the ASIC chip 30 is determined based on either the position of the ASIC chip 30 or the lead terminals 41. The opening 50 is formed by, for example, transfer molding using the mold, and the position of the mold is determined based on the lead terminals 41.

A reference numeral "25" illustrated in FIG. 4 indicates a formation allowable region where the formation of the humidity detector 21 and the temperature detector 22 on the sensor chip 20 is allowed. The formation allowable region 25 is set within the opening 50, thereby allowing the formation allowable region 25 to be securely exposed through the opening 50 even if the positions of the ASIC chip 30, the sensor chip 20, and the mold are displaced during the mounting procedure. As long as the humidity detector 21 and the temperature detector 22 are formed within the formation allowable region 25, the humidity detector 21 and the temperature detector 22 are securely exposed through the opening 50 regardless of the positional displacement.

[Configuration of Sensor Chip]

Next, a configuration of the sensor chip 20 will be described.

Figure 5:
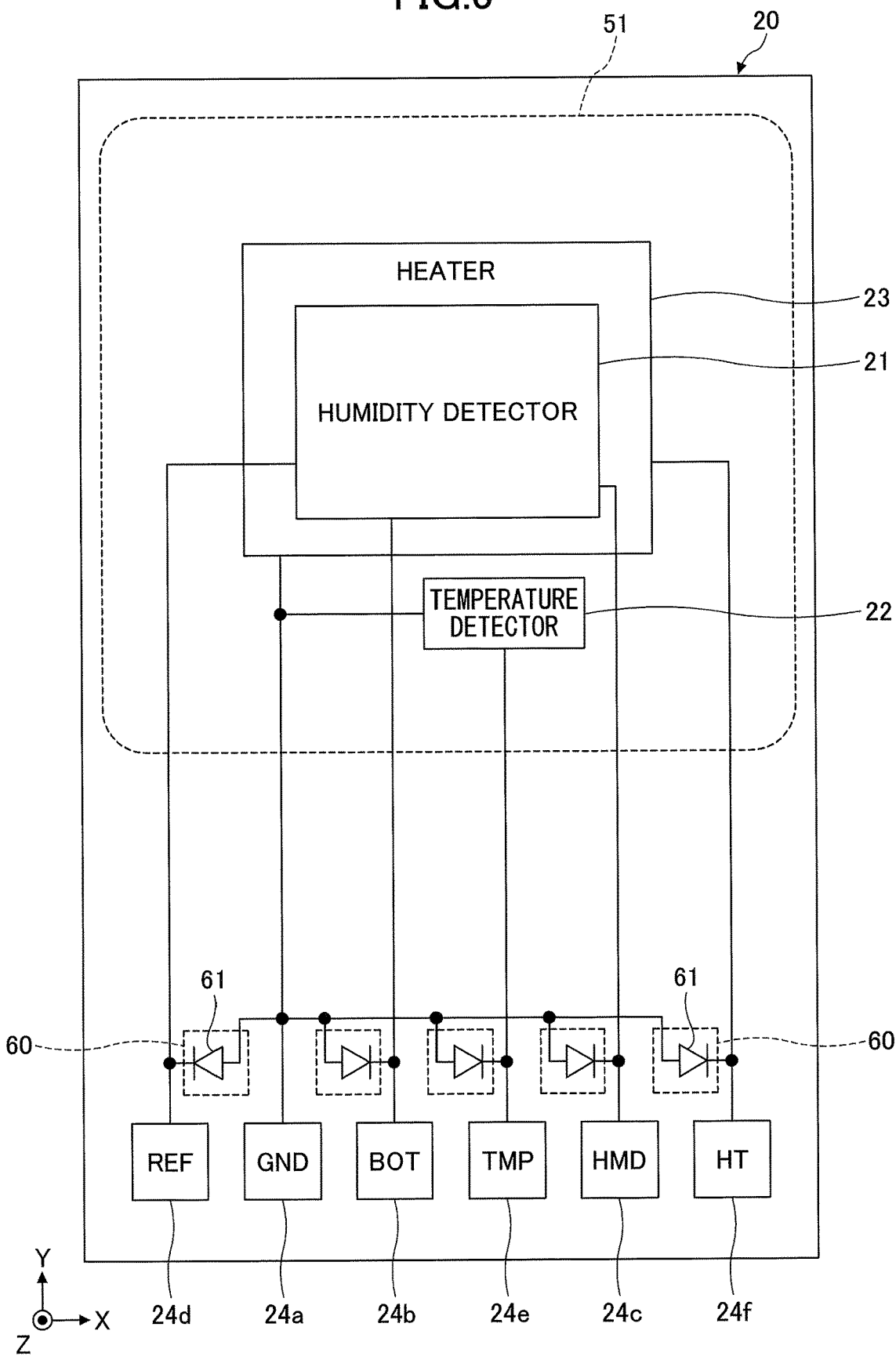
FIG. 5 is a schematic plan view of a configuration of a sensor chip.

FIG. 5 is a schematic plan view of a configuration of the sensor chip 20. The above-described pads 24 are terminals that may be used to apply voltages from the outside and detect potentials. The plurality of pads 24 illustrated in FIG. 4 are distinguishably illustrated as pads 24a through 24f in FIG. 5. If the pads 24a through 24f are not required to be distinguished, the pads 24a through 24f are simply referred to as "pads 24".

The pad 24a serves as a ground electrode terminal (GND) grounded to the ground potential. The pad 24a is electrically connected to various units such as the temperature detector 22 and the heater 23 via wiring and a substrate.

The pad 24b is a lower electrode terminal (BOT) electrically connected to a lower electrode 83 of the humidity detector 21. The pad 24b is used to supply a driving voltage to the lower electrode 83. The pad 24c is a humidity detecting terminal (HMD) electrically connected to an upper electrode 84 of the humidity detector 21. The pad 24c is used to acquire a relative humidity detection signal from the upper electrode 84. The pad 24d is a reference electrode terminal (REF) electrically connected to a reference electrode 82 of the humidity detector 21. The pad 24d is used to acquire a reference signal for humidity detection from the reference electrode 82.

The pad 24e is a temperature detecting terminal (TMP) electrically connected to the temperature detector 22. The pad 24e is used to acquire a temperature detection signal. The pad 24f is a heating terminal (HT) electrically connected to the heater 23. The pad 24f is used to supply a driving voltage for driving the heater 23.

Further, electrostatic discharge (ESD) protection circuits 60 are connected to the respective pads 24b through 24f, except for the pad 24a. Each of the ESD protection circuits 60 is electrically connected between the pad 24a and a corresponding pad of the pads 24b through 24f. The pad 24a serves as the ground electrode terminal and the pads 24b through 24f are used as input terminals or output terminals. In the present embodiment, each of the ESD protection circuits 60 includes one diode 61. The anode side of the diode 61 is connected to the pad 24a, and the cathode side of the diode 61 is connected to a corresponding pad of the pads 24b through 24f.

The ESD protection circuits 60 are preferably arranged near the pads 24b through 24f, so as to be separated as much as possible from the effective opening 51. Because the ESD protection circuits 60 are covered by the molded resin 40, an unnecessary electric current would not be produced by a photoelectric effect.

[Configuration of ESD Protection Circuit]

Next, a configuration of an ESD protection circuit 60 will be described.

Figure 6:
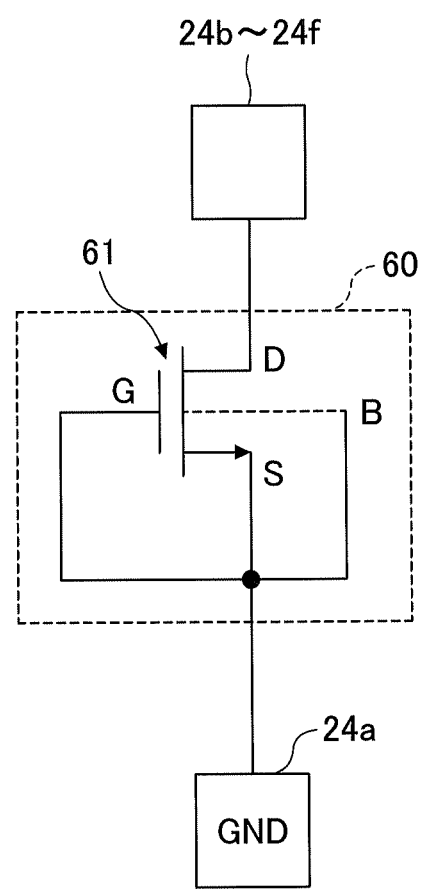
FIG. 6 is a circuit diagram illustrating a configuration of an ESD protection circuit.

FIG. 6 is a circuit diagram illustrating the configuration of the ESD protection circuit 60. As illustrated in FIG. 6, a diode 61 of the ESD protection circuit 60 is formed by an N-channel metal-oxide-semiconductor (MOS) transistor (hereinafter referred to as an NMOS transistor). Specifically, the diode 61 is formed by the NMOS transistor having a source, a gate, and a back gate that are short-circuited (that is, diode-connected). The short-circuited part of the NMOS transistor functions as an anode of the diode 61, and a drain of the NMOS transistor functions as a cathode of the diode 61.

Figure 7:
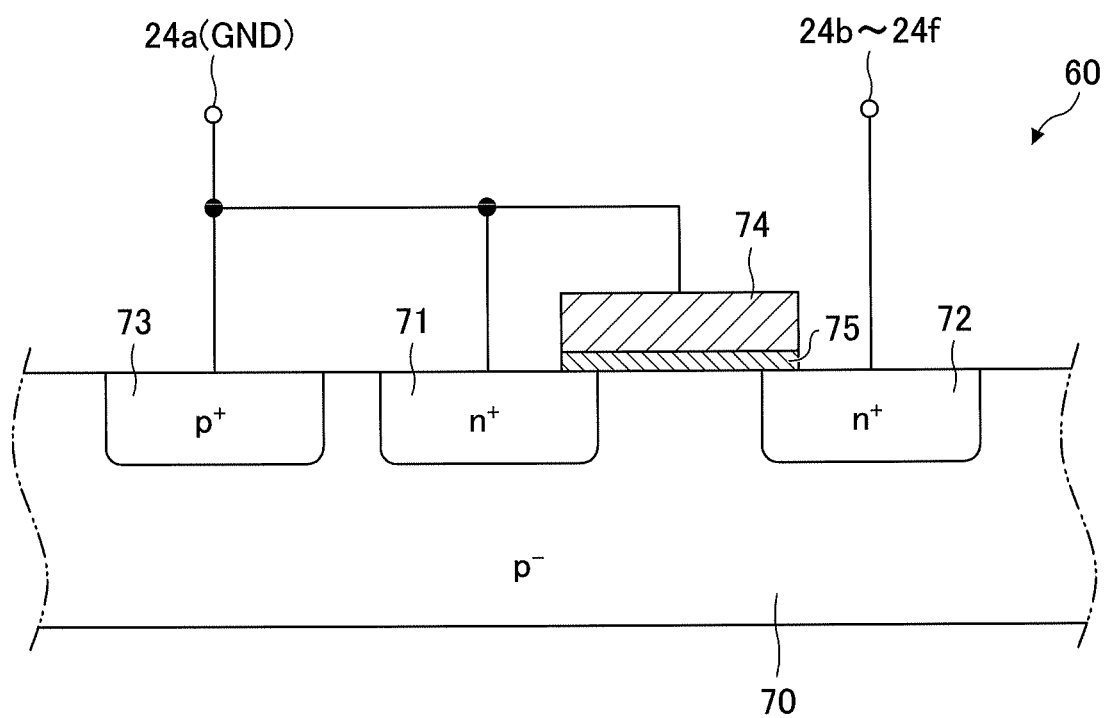
FIG. 7 is a diagram illustrating a layer structure of an NMOS transistor forming the ESD protection circuit.

FIG. 7 is a diagram illustrating a layer structure of the NMOS transistor forming the ESD protection circuit 60. The NMOS transistor illustrated in FIG. 7 includes a p-type semiconductor substrate 70, two n-type diffusion layers 71 and 72 formed in the surface layer of the p-type semiconductor substrate 70, which constitutes the sensor chip 20, a contact layer 73, and a gate electrode 74. The gate electrode 74 is formed on the surface of the p-type semiconductor substrate 70 via a gate insulating film 75. The gate electrode is disposed between the two n-type diffusion layers 71 and 72.

For example, the n-type diffusion layer 71 functions as the source, and the n-type diffusion layer 72 functions as the drain. The contact layer is a low-resistance layer (p-type diffusion layer) for making an electrical connection to the p-type semiconductor substrate 70, which functions as the back gate. The n-type diffusion layer 71, the gate electrode 74, and the contact layer 73 are connected in common and short-circuited. The short-circuited part functions as the anode, and the n-type diffusion layer 72 functions as the cathode.

The p-type semiconductor substrate 70 may be a p-type silicon substrate. The gate electrode may be formed of polycrystalline silicon (polysilicon). The gate insulating film 75 may be formed of an oxide film such as silicon dioxide.

[Configuration of Humidity Detector]

Next, a configuration of the humidity detector 21 will be described.

Figure 8:
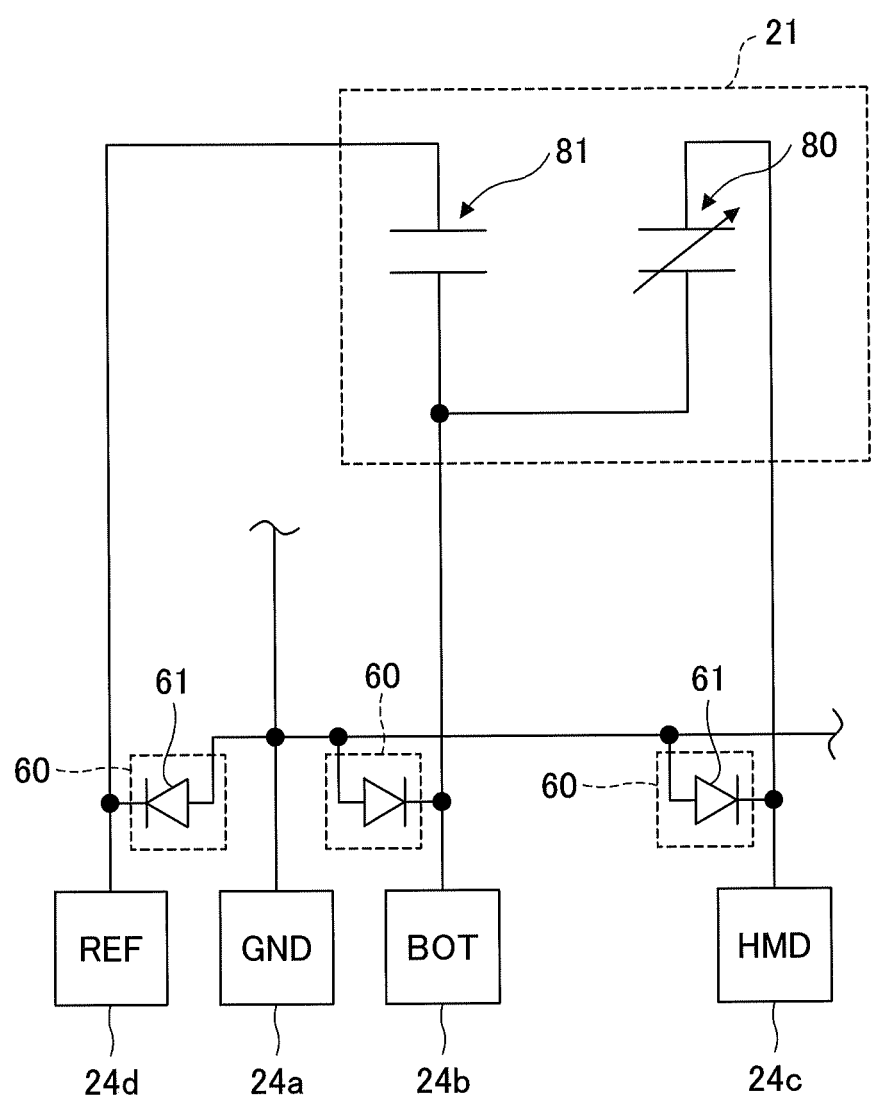
FIG. 8 is a circuit diagram illustrating a configuration of a humidity detector.

FIG. 8 is a circuit diagram illustrating the configuration of the humidity detector 21. As illustrated in FIG. 8, the humidity detector 21 includes a humidity detecting capacitor 80 and a reference capacitor 81.

In the humidity detector 21, one electrode of the humidity detecting capacitor 80 is the lower electrode 83 and is electrically connected to the pad 24b, which serves as the lower electrode terminal. The other electrode of the humidity detecting capacitor 80 is the upper electrode 84, and is electrically connected to the pad 24c, which serves as the humidity detecting terminal. One electrode of the reference capacitor 81 is the lower electrode 83, which is used in common between the humidity detecting capacitor 80 and the reference capacitor 81. The other electrode of the reference capacitor 81 is the reference electrode 82 and is electrically connected to the pad 24d, which serves as the reference electrode terminal.

A humidity sensing film 86, which will be described below, is provided between the electrodes of the humidity detecting capacitor 80. The humidity sensing film 86 is formed of a polymeric material such as polyimide that adsorbs moisture in the air and whose dielectric constant varies in accordance with the amount of adsorbed moisture. Accordingly, the electrostatic capacitance of the humidity detecting capacitor 80 varies in accordance with the amount of moisture adsorbed by the humidity sensing film 86.

A second insulating film 111 (see FIG. 10), which will be described below, is provided between the electrodes of the reference capacitor 81. The second insulating film 111 is formed of an insulating material such as silicon dioxide ($SiO_2$) that does not adsorb moisture. Accordingly, the electrostatic capacitance of the reference capacitor 81 does not vary or only slightly varies.

The amount of moisture included in the humidity sensing film 86 corresponds to ambient humidity of the sensor module 10. Thus, relative humidity can be measured by detecting a difference in electrostatic capacitance between the humidity detecting capacitor 80 and the reference capacitor 81. The measurement of relative humidity is performed by the humidity measuring processor 31 (see FIG. 13) included in the ASIC chip 30, based on the potential of the pad 24c, which serves as the humidity detecting terminal, and the potential of the pad 24d, which serves as the reference electrode terminal.

[Configuration of Temperature Detector]

Next, a configuration of the temperature detector 22 will be described.

Figure 9:
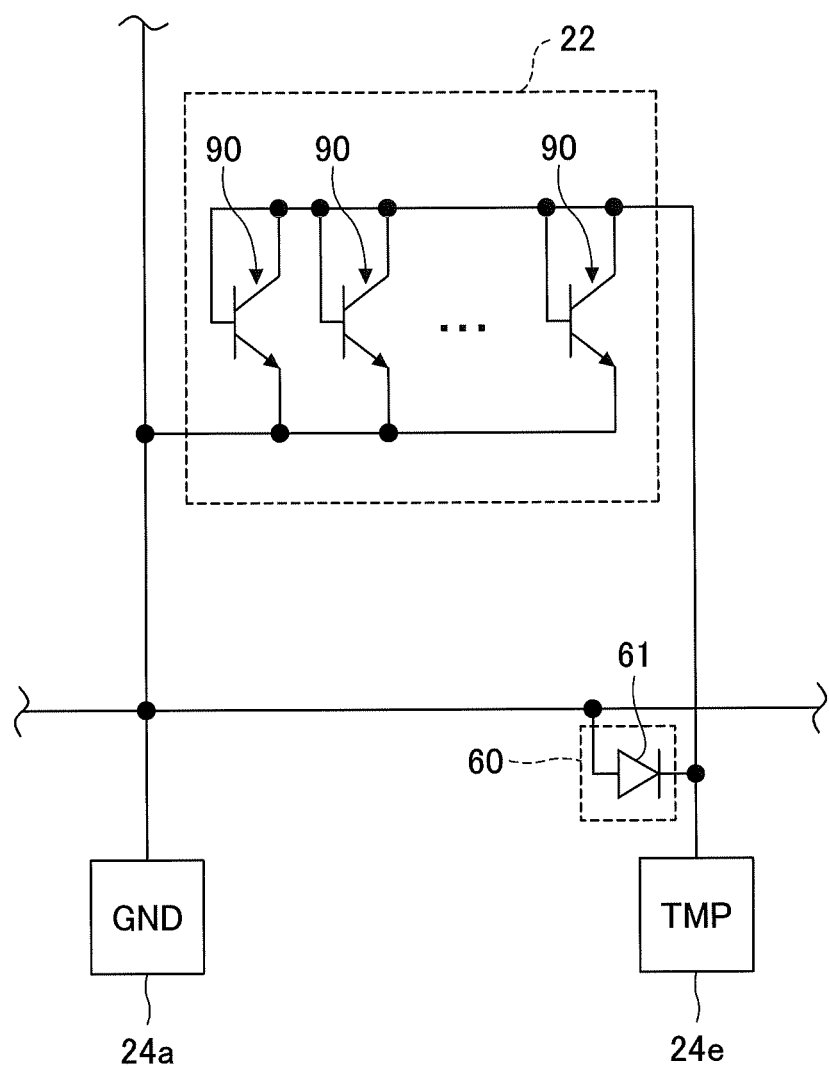
FIG. 9 is a circuit diagram illustrating a configuration of a temperature detector.

FIG. 9 is a circuit diagram illustrating the configuration of the temperature detector 22. The temperature detector 22 is a band-gap type temperature sensor that detects the temperature by utilizing the electrical property (band cap) of the semiconductor that varies in proportion to a temperature change. For example, the temperature detector 22 includes one or more of bipolar transistors, in each of which two terminals of a base, an emitter, and a collector are connected. The temperature detector 22 measures the temperature by detecting the resistance between the two terminals.

As illustrated in FIG. 9, in the present embodiment, the temperature detector 22 includes a plurality of (for example, eight) npn type bipolar transistors 90 connected in parallel. In each of the bipolar transistors 90, a base and a collector are connected to each other. By connecting the plurality of bipolar transistors 90 in parallel, a junction area of a p-n junction can be increased, and the ESD resistance can be thus improved.

In each of the bipolar transistors 90, the emitter is electrically connected to the pad 24a, which serves as the ground electrode terminal, and the base and the collector are connected to the pad 24e, which serves as the temperature detecting terminal.

The temperature is measured by the temperature measuring processor 32 (see FIG. 13) included in the ASIC chip 30, based on the potential of the pad 24e.

[Device Structure of Sensor Chip]

Next, a device structure of the sensor chip 20 will be described.

Figure 10:
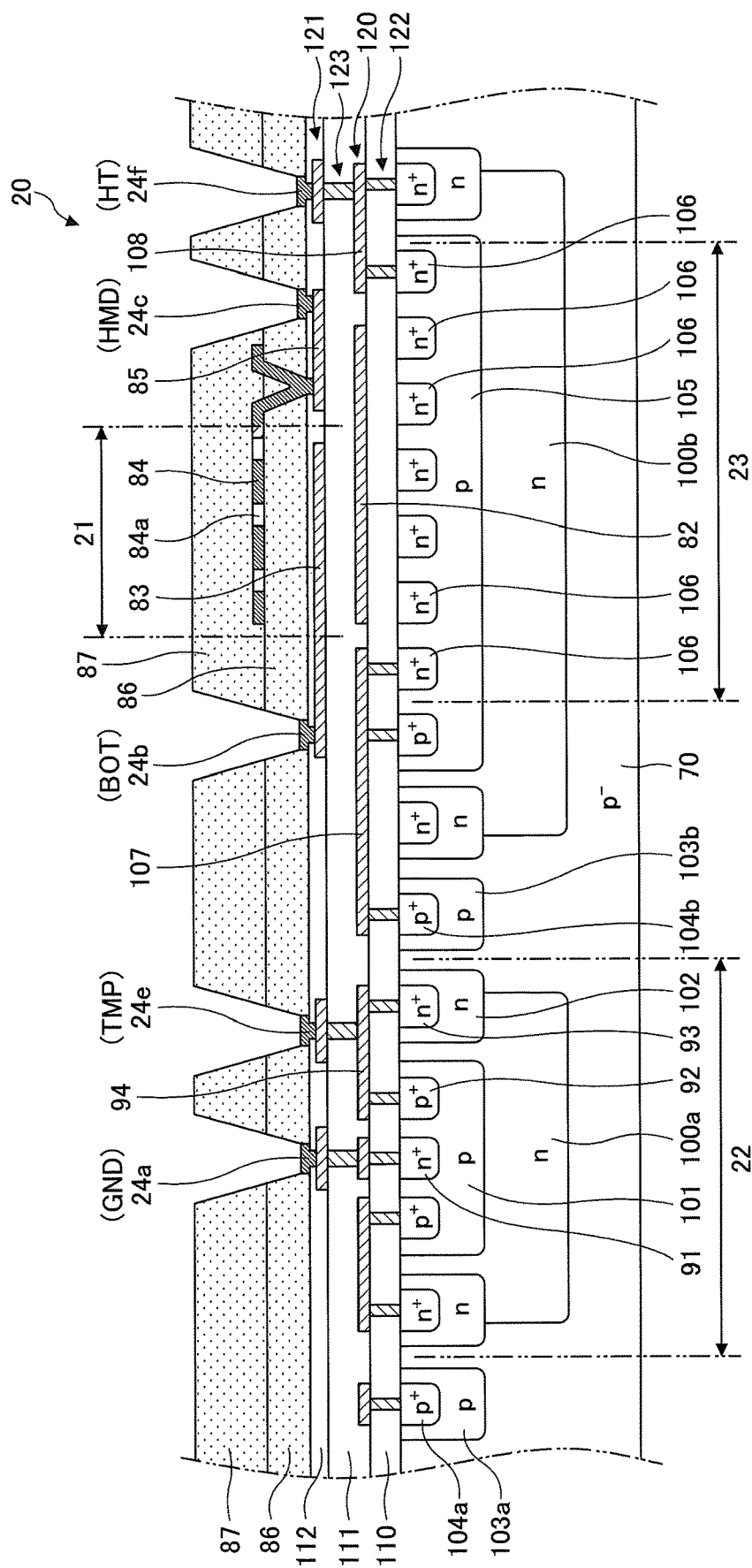
FIG. 10 is a schematic cross-sectional view of a device structure of the sensor chip.

FIG. 10 is a schematic cross-sectional view of the device structure of the sensor chip 20. In order to facilitate understanding of the structure, the pads 24a, 24b, 24c, and 24e are drawn in the same cross section as the humidity detector 21, the temperature detector 22, and the heater 23 in FIG. 10; however, this does not mean that the pads 24 are actually located in the same cross section as the humidity detector 21, the temperature detector 22, and the heater 23. Further, in order to facilitate the understanding of the structure, the humidity detector 21, the temperature detector 22, and the heater 23 are simplified, and the positional relationship of the units illustrated in FIG. 10 is different from the actual positional relationship.

As illustrated in FIG. 10, the sensor chip 20 includes the above-described p-type semiconductor substrate 70. A first deep n-well 100a and a second deep n-well 100b are formed in the p-type semiconductor substrate 70. The temperature detector 22 is formed in the first deep n-well 100a, and the heater 23 is formed in the second deep n-well 100b.

P-wells 103a and 103b are formed in the surface layer of the p-type semiconductor substrate 70 where neither the first deep n-well 100a nor the second deep n-well 100b is formed. Contact layers 104a and 104b, which are p-type diffusion regions, are formed in the surface layers of the p-wells 103a and 103b, respectively. The contact layers 104a and 104b are low-resistance layers (p-type diffusion layers) for making an electrical connection between the p-type semiconductor substrate 70 and predetermined wiring layers formed on the p-type semiconductor substrate 70.

A p-well 101 and an n-well 102 are formed in the surface layer of the first deep n-well 100a. An n-type diffusion layer 91 and a p-type diffusion layer 92 are formed in the surface layer of the p-well 101. An n-type diffusion layer 93 is formed in the surface layer of the n-well 102. The n-type diffusion layer 91, the p-type diffusion layer 92, and the n-type diffusion layer 93 form an npn-type bipolar transistor 90 as described above, and function as an emitter, a base, and a collector, respectively.

A p-well 105 is formed in the surface layer of the second deep n-well 100b. One or more n-type diffusion layers 106 are formed in the surface layer of the p-well 105. In the present embodiment, a plurality of n-type diffusion layers 106 are formed. For example, the n-type diffusion layers 106 extend in a direction perpendicular to the paper surface of FIG. 10, and form a one-dimensional grating pattern as a whole (see FIG. 12). Each of the n-type diffusion layers 106 has a predetermined resistance (for example, a sheet resistance of approximately 3Ω), and functions as a resistor that generates heat when a current flows through the resistor. In other words, the n-type diffusion layers 106 form the above-described heater 23.

Each layer of the p-type semiconductor substrate 70 is formed by an existing semiconductor manufacturing process (a CMOS process). Accordingly, the n-type diffusion layers 106, which function as the resistors, are formed by the same manufacturing process as the n-type diffusion layers 91 and 93, included in a part of the temperature detector 22. The n-type diffusion layers 106, 91, and 93 are formed simultaneously by an ion implantation process in which n-type impurities (such as phosphorus) are implanted into the p-type semiconductor substrate 70. In other words, the n-type diffusion layers 106, functioning as the resistors, and the n-type diffusion layers 91 and 93, included in the part of the temperature detector 22, have the same depth from the surface of the p-type semiconductor substrate 70. In addition, the n-type diffusion layers 106 and the p-type diffusion layer 92 included in a part of the temperature detector 22 may have the same depth from the surface of the p-type semiconductor substrate 70.

Further, instead of the ion implantation process, the n-type diffusion layers 106, 91, and 93 may be formed by a thermal diffusion process in which impurities are added to the p-type semiconductor substrate 70 by applying thermal processing.

In addition, the above-described n-type diffusion layers 71 and 72 of the ESD protection circuit 60 are formed by the same manufacturing process (ion implantation process or thermal diffusion process) as the n-type diffusion layers 106, 91, and 93. The contact layer 73 is formed by the same manufacturing process (ion implantation process or thermal diffusion process) as the p-type diffusion layer 92 and the contact layers 104a and 104b.

Other layers of the p-type semiconductor substrate 70 mainly function as contact layers, and thus a description thereof will be omitted.

A first insulating film 110, the second insulating film 111, and a third insulating film 112 are stacked in this order on the surface of the p-type semiconductor substrate 70. The insulating films 110, 111, and 112 are formed of an insulating material such as silicon dioxide ($SiO_2$) or silicon nitride (SiN).

A first wiring layer 120 is formed on the first insulating film 110. A second wiring layer 121 is formed on the second insulating film 111. The second insulating film 111 covers the first wiring layer 120. The third insulating film 112 covers the second wiring layer 121. The first wiring layer 120 and the second wiring layer 121 are formed of an electrically conductive material such as aluminum.

A first plug layer 122, having a plurality of first plugs for electrically connecting the first wiring layer 120 to the p-type semiconductor substrate 70, is formed in the first insulating film 110. A second plug layer 123, having a plurality of second plugs for electrically connecting the first wiring layer 120 to the second wiring layer 121, is formed in the second insulating film 111. The first plug layer 122 and the second plug layer 123 are formed of an electrically conductive material such as tungsten.

For example, wiring 94 for connecting the base to the collector of the above-described bipolar transistor 90 is formed by the first wiring layer 120, and is electrically connected to the p-type diffusion layer 92 and the n-type diffusion layer 93 via the first plug layer 122. In addition, the wiring 94 is electrically connected to the pad 24e, which serves as the temperature detecting terminal, via the second plug layer 123 and the second wiring layer 121. Further, the n-type diffusion layer 91, which serves as the emitter of the bipolar transistor 90, is electrically connected to the pad 24a, which serves as the ground electrode terminal, via the first plug layer 122, the first wiring layer 120, and the second wiring layer 121.

Wiring 107 for grounding one end of the heater 23 to the ground potential is formed by the first wiring layer 120, and is electrically connected to an n-type diffusion layer 106 and a contact layer 104b via the first plug layer 122. In addition, wiring 108 for electrically connecting the other end of the heater 23 to the pad 24f, which serves as the heating terminal, is electrically connected to an n-type diffusion layer 106 via the first plug layer 122, and is electrically connected to the pad 24f via the second plug layer 123 and the second wiring layer 121.

The reference electrode 82 of the reference capacitor 81 is formed by the first wiring layer 120, and is electrically connected to the pad 24d (not illustrated in FIG. 10), which serves as the reference electrode terminal, via the second plug layer 123 and the second wiring layer 121.

Further, the lower electrode 83 of the humidity detecting capacitor 80 is formed by the second wiring layer 121, and is electrically connected to the pad 24b, which serves as the lower electrode terminal. Moreover, wiring 85 for electrically connecting the upper electrode 84 of the humidity detecting capacitor 80 to the pad 24c, which serves as the humidity detecting terminal, is formed by the second wiring layer 121. The lower electrode 83 is formed on the second insulating film 111 on the opposite side of the reference electrode 82.

The pads 24a through 24f are formed on the third insulating film 112, and are formed of an electrically conductive material such as aluminum (Al). The pads 24a through 24f are electrically connected to the second wiring layer 121 through the third insulating film 112.

The humidity sensing film 86 is formed on the third insulating film 112. The humidity sensing film 86 may have a thickness of 0.5 μm to 1.5 μm, and is formed of a polymeric material that readily adsorbs and desorbs water molecules in accordance with the humidity. The humidity sensing film 86 may be a polyimide film having a thickness of 1 μm, for example. The polymeric material forming the humidity sensing film 86 is not limited to polyimide, and may be cellulose, polymethyl methacrylate (PMMA), or polyvinyl alcohol (PVA).

The upper surface of the humidity sensing film 86 is flat, and the plate-shaped upper electrode 84 is formed on the upper surface of the humidity sensing film 86. The upper electrode 84 is formed on the humidity sensing film 86 on the opposite side of the lower electrode 83. A part of the upper electrode 84 is electrically connected to the wiring 85. The upper electrode 84 is an electrically conductive layer made of aluminum and having a thickness of 200 nm, for example. The upper electrode 84 has a plurality of openings 84a that allow water molecules in the air to be efficiently adsorbed into the humidity sensing film 86.

An overcoat film 87 is formed on the humidity sensing film 86 so as to cover the upper electrode 84. The overcoat film 87 is made of a polymeric material. For example, the overcoat film 87 may be made of the same material as the humidity sensing film 86. The overcoat film 87 may have a thickness of 0.5 μm to 10 μm.

The humidity sensing film 86 and the overcoat film 87 have openings through which the pads 24a through 24f are exposed.

As described above, the parallel-plate-type humidity detecting capacitor 80 is configured by the lower electrode 83 and the upper electrode 84. In addition, the parallel-plate-type reference capacitor 81 is configured by the lower electrode 83 and the reference electrode 82. Further, the humidity detecting capacitor 80 and the reference capacitor 81 are provided above the heater 23.

Accordingly, when the heater 23 generates heat, the humidity sensing film 86 between the lower electrode 83 and the upper electrode 84 is heated. As a result, the temperature of the humidity sensing film 86 increases, and the amount of water molecules in accordance with the humidity is adsorbed. This causes the dielectric constant of the humidity sensing film 86 to change, and the electrostatic capacitance of the humidity detecting capacitor 80 to be decreased. Further, the temperature detector 22 detects an increase in temperature caused by the heater 23.

Figure 11:
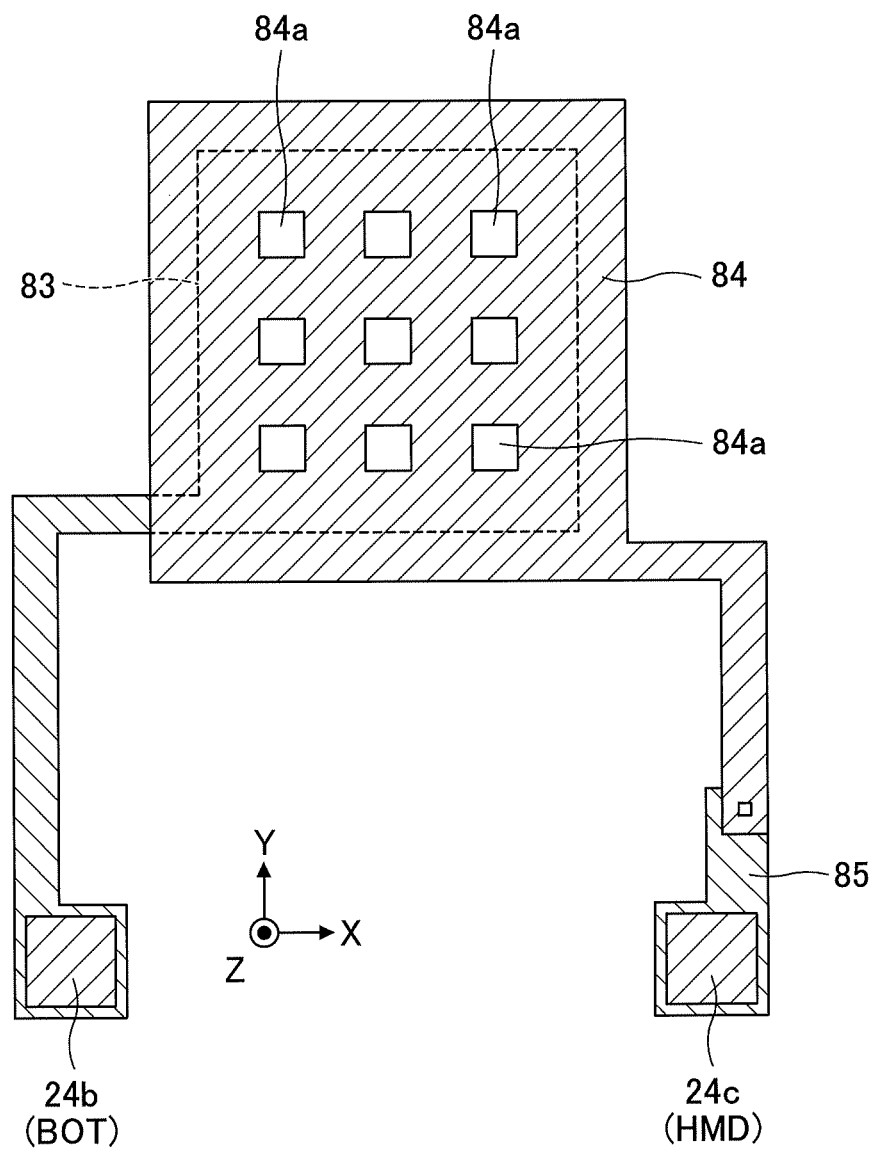
FIG. 11 is a plan view of a lower electrode and an upper electrode.

FIG. 11 is a plan view of the lower electrode 83 and the upper electrode 84. As illustrated in FIG. 11, the lower electrode 83 and the upper electrode 84 have rectangular shapes. The upper electrode 84 is formed so as to cover the lower electrode 83.

The openings 84a are preferably as small as possible. As the openings 84a become smaller, leakage of an electric field into the air can be decreased. Practically, a large number of openings 84a are formed. Note that the shape of each of the openings 84a is not limited to a square shape. The openings 84a may each have an elongated stripe shape or a circular shape. In addition, the openings 84a may be arranged in a staggered pattern. Preferably, the openings 84a each have a circular shape, and are arranged in a staggered pattern.

Although not illustrated in FIG. 11, the rectangular-shaped reference electrode 82 is formed below the lower electrode 83.

Figure 12:
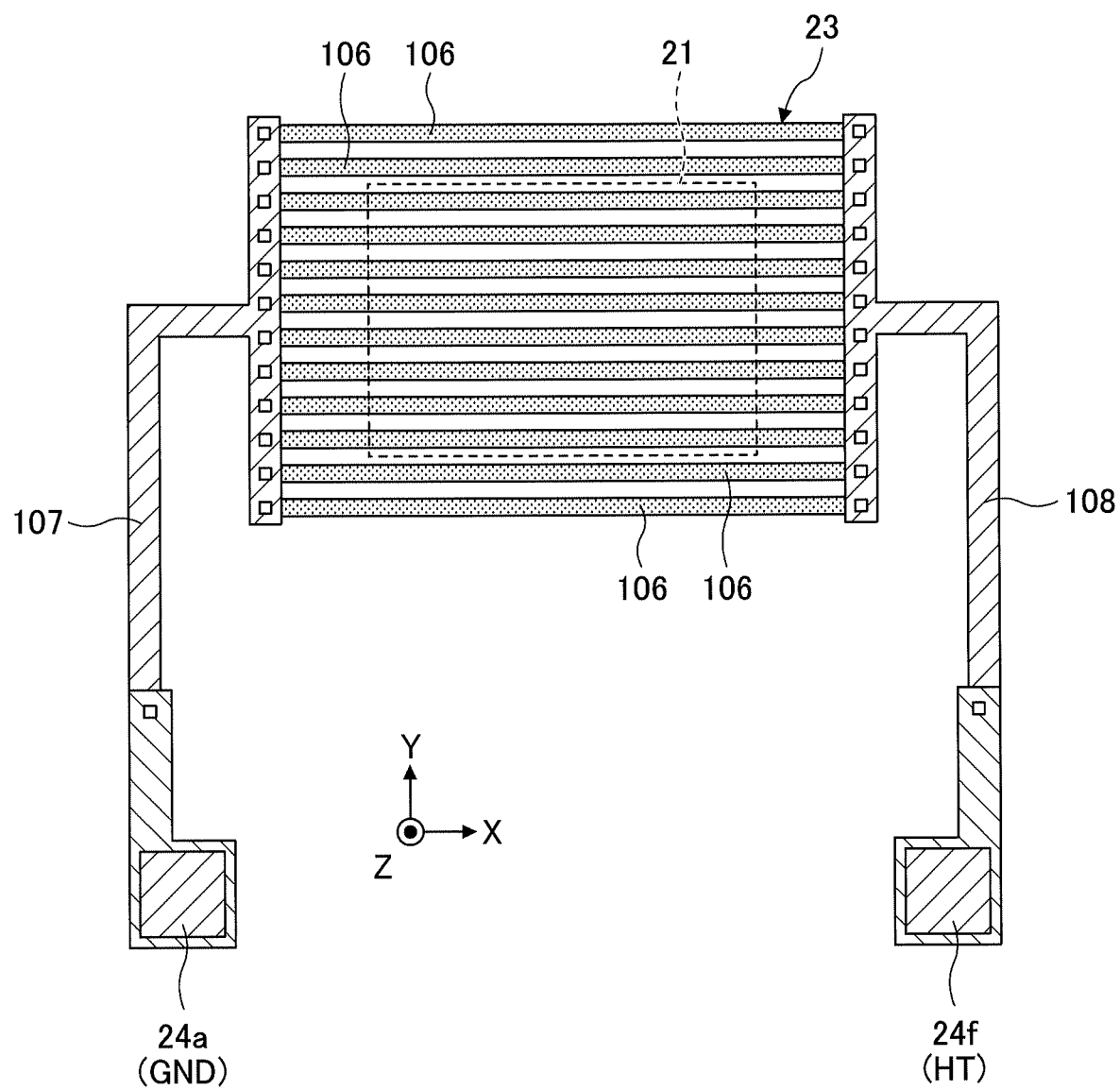
FIG. 12 is a plan view of n-type diffusion layers forming a heater.

FIG. 12 is a plan view of the n-type diffusion layers 106 forming the heater 23. As illustrated in FIG. 12, the n-type diffusion layers 106 are arranged in a one-dimensional grating pattern, in which a plurality of elongated stripe-shaped regions are arranged in parallel. One ends of the n-type diffusion layers 106, arranged in a one-dimensional grating pattern, are connected to the above-described ground wiring 107, and the other ends of the n-type diffusion layers 106 are connected to the above-described wiring 108. The heater 23 is located under the humidity detector 21 so as to cover the entire humidity detector 21.

[Functional Configuration of ASIC Chip]

Next, a functional configuration of the ASIC chip 30 will be described.

FIG. 13 is a block diagram illustrating a functional configuration of the ASIC chip 30. As illustrated in FIG. 13, the ASIC chip 30 includes the humidity measuring processor 31, the temperature measuring processor 32, and the heating controller 33.

The humidity measuring processor 31 applies a predetermined driving voltage to the pad 24b, which serves as the lower electrode terminal, and detects the potential of the pad 24c, which serves as the humidity detecting terminal, and also the potential of the pad 24d, which serves as the reference electrode terminal. Then, the humidity measuring processor 31 calculates relative humidity (% RH) based on the difference in potential between the pad 24c and the pad 24d.

The temperature measuring processor 32 detects the potential of the pad 24e, which serves as the temperature detecting terminal, and calculates the temperature corresponding to the detected potential.

The heating controller 33 applies a current (for example, approximately 10 mA) to the heater 23 by applying a predetermined driving voltage to the pad 24f, which serves as the heating terminal, so as to generate heat. The heating controller 33 controls the amount of heat by controlling the predetermined driving voltage applied to the pad 24f.

[Functional Configuration of Controller]

In FIG. 13, a functional configuration of the controller 6 is depicted. The controller 6 includes a moisture determining unit 63 and a moisture removal control unit 64. For example, the controller 6 is configured by an arithmetic device such as a microcomputer or a central processing unit (CPU), and a storage device such as a random access memory (RAM) or a read-only memory (ROM). The functions of the controller 6 are implemented by causing the arithmetic device to perform processes based on programs stored in the storage device. Note that the controller 6 may be configured by a field-programmable logic circuit such as a field-programmable gate array (FPGA).

In the present embodiment, the moisture determining unit 63 causes the heater 23 to start heating via the heating controller 33, obtains humidity readings from the humidity measuring processor 31, and determines the presence or absence of condensation. When the moisture determining unit determines that condensation has formed, the moisture removal control unit 64 operates the blowing fan 4 via the driver 5.

As described above, a moisture detector is configured by the sensor module 10, which serves as a temperature/humidity sensor, and the controller 6. Note that the controller 6 may be integrated into the sensor module 10.

[Condensation Determination Process]

Next, a process including a condensation determination process performed by the moisture determining unit 63 will be described.

Figure 14:
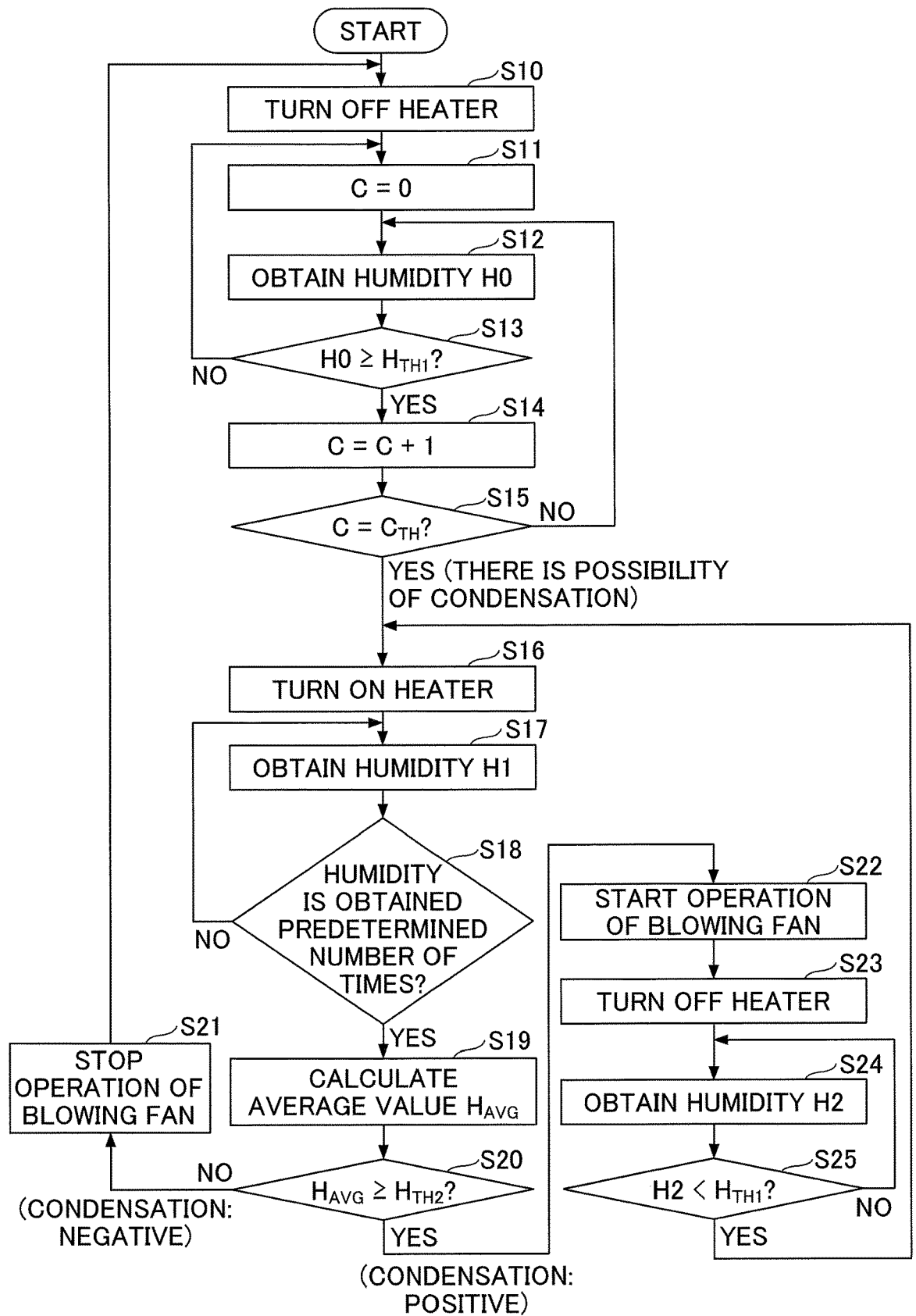
FIG. 14 is a flowchart illustrating a process including a condensation determination process.

FIG. 14 is a flowchart illustrating the process including the condensation determination process. As illustrated in FIG. 14, the moisture determining unit 63 turns off the heater 23 (step S10), and sets a counter value C to "0" (step S11). Next, the moisture determining unit 63 obtains humidity H0 measured on a detection surface by the humidity measuring processor 31 (step S12), and determines whether the obtained humidity H0 is greater than or equal to a first threshold $H_{TH1}$ (step S13). The determination in step S13 corresponds to determining whether the temperature has reached the dew point. The first threshold $H_{TH1}$ may be 100% RH, for example.

When the moisture determining unit 63 determines that the obtained humidity H0 is less than the first threshold $H_{TH1}$ (no in step S13), the process returns to step S11. In this case, the counter value C is reset (step S11), and the moisture determining unit 63 obtains humidity H0, measured by the humidity measuring processor 31, again (step S12). For example, humidity H0 may be measured and obtained at intervals of 30 seconds.

When the moisture determining unit 63 determines that the humidity H0 is greater than or equal to the first threshold $H_{TH1}$ (yes in step S13), the moisture determining unit 63 adds "1" to the counter value C (step S14).

Next, the moisture determining unit 63 determines whether the counter value C is equal to a threshold $C_{TH}$ (step S15). The threshold $C_{TH}$ may be "10", for example. When the moisture determining unit 63 determines that the counter value C is not equal to the threshold $C_{TH}$ (no in step S15), the process returns to step S12, and obtains humidity H0, measured by the humidity measuring processor 31, again (step S12).

When the moisture determining unit 63 determines that the counter value C is equal to the threshold $C_{TH}$ (yes in step S15), the process proceeds to step S16. Namely, when the number of times humidity H0 is determined to be greater than or equal to the first threshold $H_{TH1}$ is equal to the threshold $C_{TH}$, the moisture determining unit 63 estimates that there is a possibility of condensation, and causes the process to proceed to step S16.

In step S16, the moisture determining unit turns on the heater 23. When the heater 23 generates heat and starts heating the detection surface, the moisture determining unit 63 obtains humidity H1 measured on the detection surface by the humidity measuring processor 31 (step S17). In step S17, humidity H1 is measured and obtained multiple times at predetermined time intervals (for example, at intervals of one second). The moisture determining unit 63 determines whether humidity H1 is obtained a predetermined number of times (for example, 15 times) (step S18). When the moisture determining unit 63 determines that humidity H1 is obtained the predetermined number of times (yes in step S18), the moisture determining unit 63 calculates an average value $H_{AVG}$ of the humidity H1 obtained the predetermined number of times (step S19).

Then, the moisture determining unit 63 determines whether the average value $H_{AVG}$ is greater than or equal to a second threshold $H_{TH2}$ (step S20). The second threshold $H_{TH2}$ may be 85% RH, for example. Note that the second threshold $H_{TH2}$ is not limited to 85% RH, and may be appropriately changed.

When it is determined that the average value $H_{AVG}$ is less than the second threshold $H_{TH2}$ (no in step S20), the moisture determining unit 63 determines that there is no condensation on the detection surface (the surface of the sensor chip 20 within the effective opening 51) of the sensor module 10 (the presence of condensation is negative), and the moisture determining unit 63 causes the process to return to step S10. At this time, if the blowing fan 4 is operating, the moisture determining unit 63 causes the moisture removal control unit 64 to stop the operation of the blowing fan 4 (step S21). Conversely, when it is determined that the average value $H_{AVG}$ is greater than or equal to the second threshold $H_{TH2}$ (yes in step S20), the moisture determining unit 63 determines that condensation has formed on the detection surface of the sensor module (the presence of condensation is positive), and the moisture determining unit 63 causes the process to proceed to step S22.

The determination in step S20 is made based on the fact that humidity changes on the detection surface after the sensor chip 20 is heated by the heater 23 differ depending on whether there is condensation, that is, depending on whether water droplets (condensed water droplets) adhere to the detection surface. Specifically, if there is no condensation and no water droplet adhering to the detection surface, humidity on the detection surface decreases and the average value $H_{AVG}$ becomes less than the second threshold $H_{TH2}$ within a short period of time after the start of heating. Conversely, if condensation has formed and water droplets adhere to the detection surface, humidity does not decrease after the start of heating, as long as there are water droplets adhering on the detection surface. Therefore, humidity on the detection surface is maintained at or above the second threshold $H_{TH2}$ for a long period of time.

In step S22, the moisture determining unit causes the moisture removal control unit 64 to start the operation of the blowing fan 4. The operation of the blowing fan 4 allows dry air to flow into the crisper drawer 3 in which the sensor module 10 is accommodated.

Next, while the blowing fan 4 is in operation, the moisture determining unit 63 turns off the heater 23 (step S23) so as to cause the heater 23 to stop heating the sensor chip 20. With the heater 23 being turned off, the moisture determining unit 63 obtains humidity H2 measured by the humidity measuring processor 31 (step S24), and determines whether the obtained humidity H2 is less than the first threshold $H_{TH1}$ (step S25).

When the moisture determining unit 63 determines that the humidity H2 is not less than the first threshold $H_{TH1}$ (no in step S25), the process returns to step S24. Humidity H2 may be measured and obtained at intervals of 30 seconds, for example. When the moisture determining unit 63 determines that the humidity H2 is less than the first threshold $H_{TH1}$ (yes in step S25), the process proceeds to step S16. Then, the condensation determination process, that is steps S16 through S20, is performed again while the blowing fan 4 is in operation. Note that a value of the first threshold $H_{TH1}$ in step S25 may be the same value set in step S13, or may be a different value that is lower than the value set in step S13.

In order to ensure that water droplets have been removed from the detection surface, the condensation determination process is performed for the second time as described above. Therefore, in step 20, it is normally determined that there is no condensation (the presence of condensation is negative) unless any abnormality is present. When it is determined that there is no condensation, the process proceeds to step S21 and the operation of the blowing fan 4 is stopped.

As described above, the presence of condensation is determined based on a difference in changes in humidity on the detection surface after the sensor chip 20 starts to be heated. Therefore, the presence of condensation can be quickly and accurately detected. Further, the moisture detector according to the present embodiment is not required to include optical components such as an optical dew point meter, as long as the humidity detector, the heater, and the controller are included. Therefore, according to the present embodiment, the small in size and inexpensive moisture detector can be provided. Further, in the moisture detector according to the present embodiment, humidity, temperature, and condensation can be detected by only the one sensor chip 20.

[Experimental Results]

Next, the results of experiments on changes in humidity after the sensor chip 20 starts to be heated will be described. The following results were obtained from the experiments in which a mock environment of the crisper drawer 3 was created by placing the sensor module 10 on a Peltier element and cooling the sensor module 10.

Figure 15:
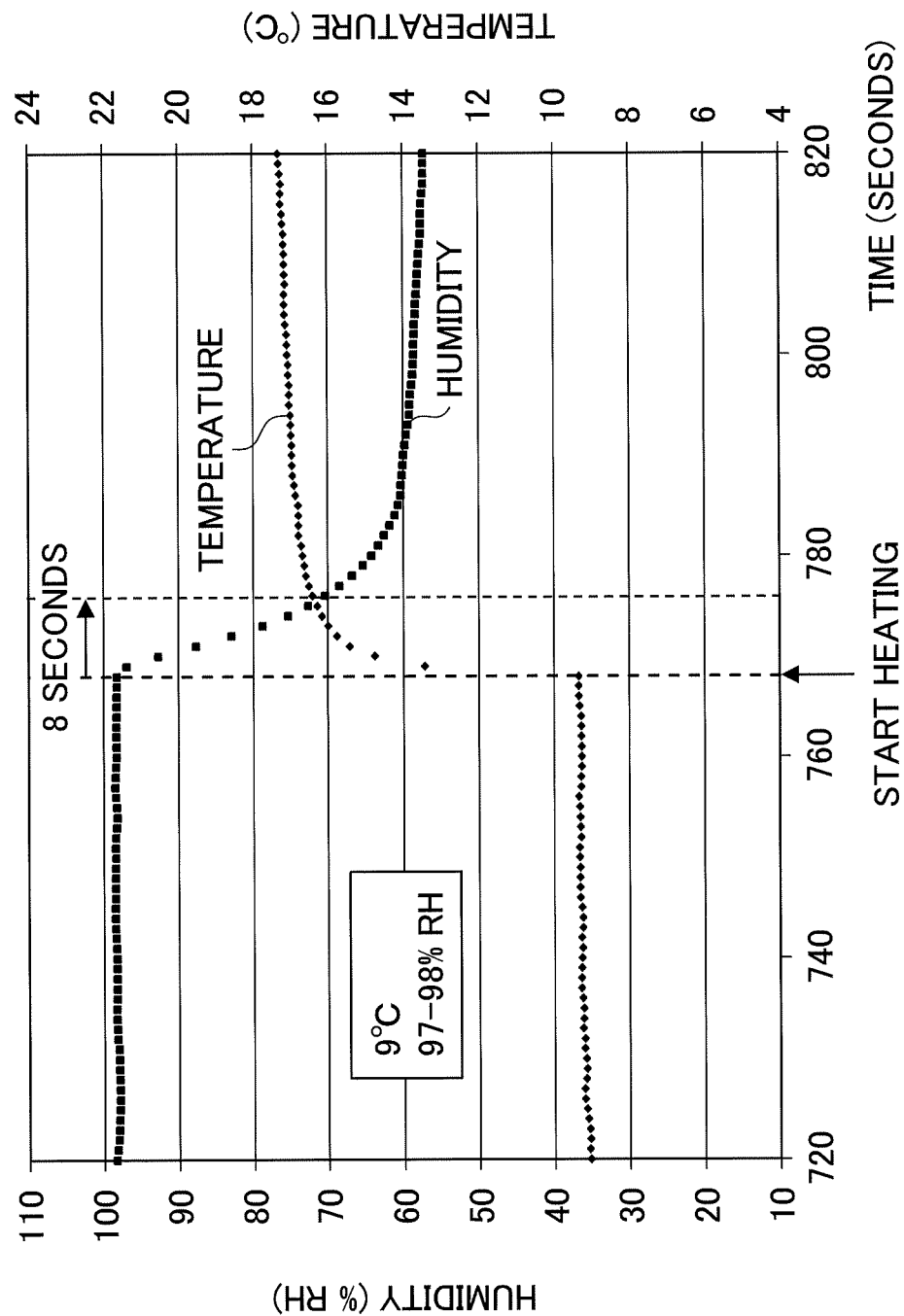
FIG. 15 is a graph illustrating the results of a first experiment when there is no condensation.

FIG. 15 is a graph illustrating the results of a first experiment when there is no condensation. Specifically, FIG. 15 illustrates changes in humidity and temperature after the heater 23 is turned on while the temperature is maintained at approximately 9° C. and the humidity is maintained at 97% to 98% RH by adjusting the current of the Peltier element with the heater 23 being turned off.

As illustrated in FIG. 15, when there was no condensation and no water droplets adhering to the detection surface of the sensor chip 20, a rapid increase in temperature and a rapid decrease in humidity were observed after the heater 23 was turned on to start heating. In this experiment, the humidity (corresponding to the above-described humidity H1) was decreased to 70% RH in approximately 8 seconds after the start of heating. The average value $H_{AVG}$ of the humidity H1 was approximately 76.5% RH for 15 seconds after the start of heating, and the average $H_{AVG}$ was less than the above-described second threshold $H_{TH2}$ (85% RH).

Figure 16:
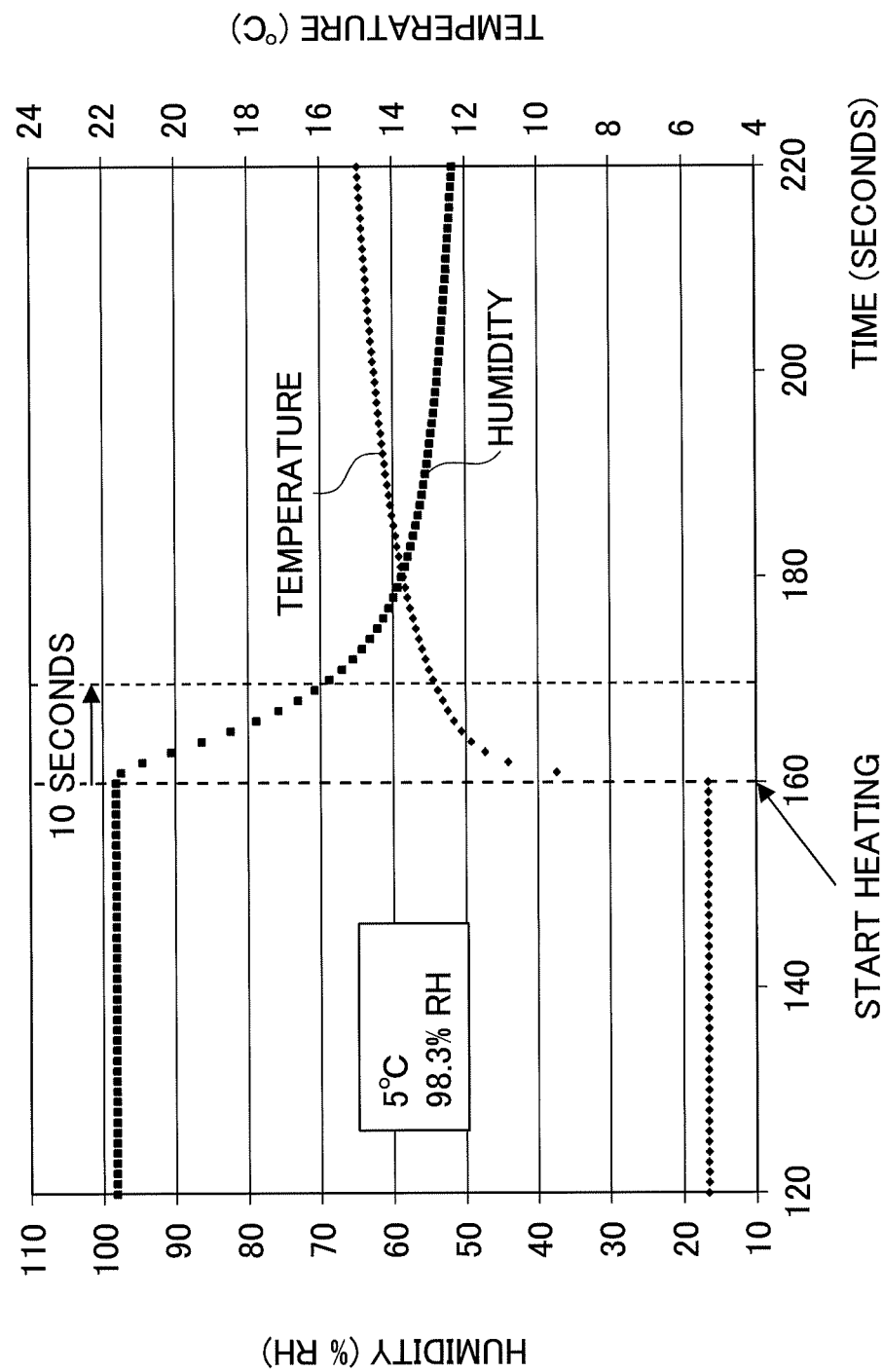
FIG. 16 is a graph illustrating the results of a second experiment when there is no condensation.

FIG. 16 is a graph illustrating the results of a second experiment when there is no condensation. Experimental conditions of the second experiment differ from those of the first experiment in that the heater 23 is turned on while the temperature is maintained at approximately 5° C. and the humidity is maintained at 98.3% RH. In the second experiment, the humidity (corresponding to the above-described humidity H1) was decreased to 70% RH in approximately 10 seconds after the start of heating. The average value $H_{AVG}$ of the humidity H1 was approximately 78.5% RH for 15 seconds after the start of heating, and it was verified that the average value $H_{AVG}$ was less than the above-described second threshold $H_{TH2}$ (85% RH).

Figure 17:
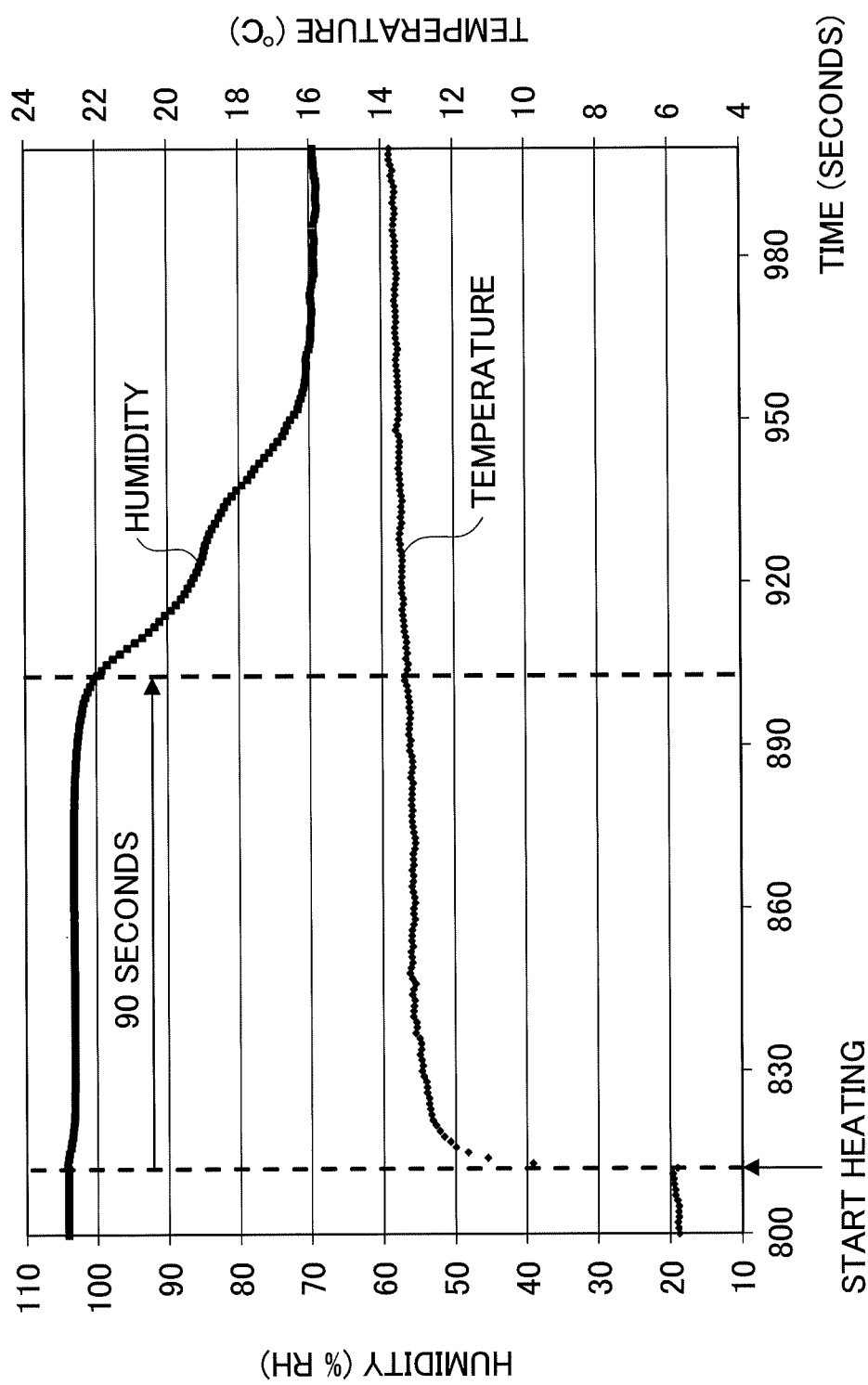
FIG. 17 is a graph illustrating the results of an experiment when condensation is present.

FIG. 17 is a graph illustrating the results of an experiment when condensation is present. In FIG. 17, due to characteristics of the sensor module 10 used in the experiment, a relative humidity of 100% or more is indicated.

As illustrated in FIG. 17, when condensation has formed, the temperature increased rapidly after the heater 23 was turned on to start heating, while it took a certain period of time for the humidity to start to decrease. Before the start of heating, water droplets condensed on the detection surface of the sensor chip 20. Therefore, it takes a certain period of time for the water droplets to be removed after the start of heating, and a high humidity level is maintained for the certain period of time.

In this experiment, it took approximately seconds before the humidity started to decrease after the start of heating. The average value $H_{AVG}$ of the humidity H1 was approximately 103.5% RH for seconds after the start of heating, and the average value $H_{AVG}$ was greater than or equal to the above-described second threshold $H_{TH2}$ (85% RH).

It was verified that, after the humidity was decreased to approximately 70% RH, water droplets were completely removed.

[Variations]

In the following, variations of the above-described first embodiment will be described.

In the above-described first embodiment, in order to detect the possibility of condensation, a preliminary determination process (steps S10 through S15) is performed before the condensation determination process (steps S16 through S20); however, the preliminary determination process (steps S10 through S15) is not required.

Further, in the above-described embodiment, after the presence of condensation is determined to be positive, a condensation removal determination process (steps S23 through S25) is performed to ensure that the condensation is removed; however, the condensation removal determination process (steps S23 through S25) is not required.

<Condensation Determination Process>

In the above-described first embodiment, after the heater 23 starts heating, humidity H1 readings are obtained multiple times, and the presence or absence of condensation is determined based on an average value $H_{AVG}$ of the humidity H1 readings. However, the average value $H_{AVG}$ is not required to be calculated. For example, the presence or absence of condensation may be determined by measuring humidity H1 when a predetermined period of time has elapsed after the start of heating, and comparing the measured humidity H1 to the second threshold $H_{TH2}$.

Further, the presence or absence of condensation may be determined based on a difference in changes in humidity H1 after the start of heating. For example, humidity H1 is obtained at intervals of time Δt after the start of heating, and a differential value ΔH (=H1(t+Δt)−H1(t)) between humidity H1(t) measured at time t after the start of heating and humidity H1(t+Δt) measured after the lapse of the time Δt is calculated. Then, the presence or absence of condensation is determined based on the number of consecutive times the differential value ΔH is greater than or equal to a reference value Hs.

Figure 18A:
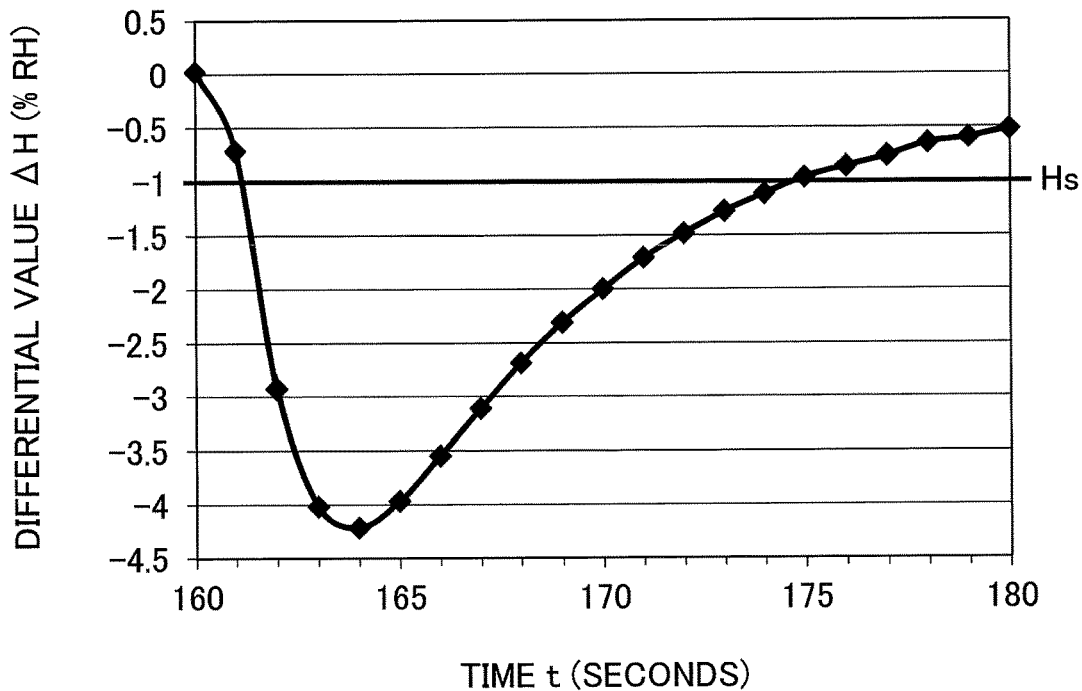
FIG. 18A and FIG. 18B are graphs each illustrating the relationship between a humidity differential value after the start of heating and time.
Figure 18B:
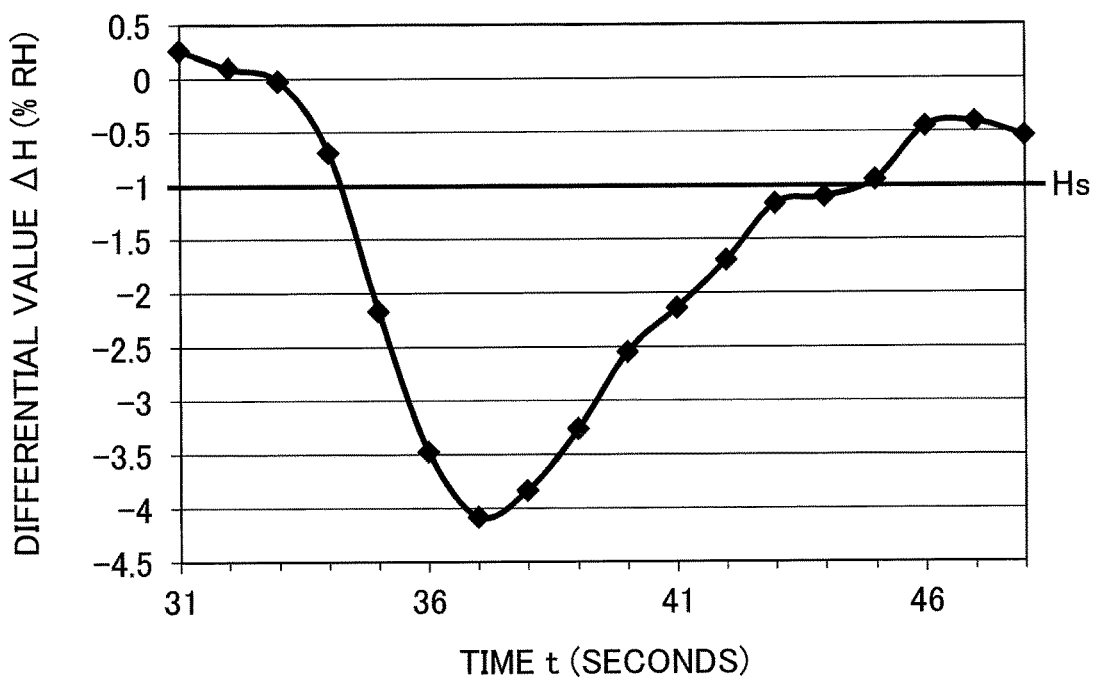
Figure 19:
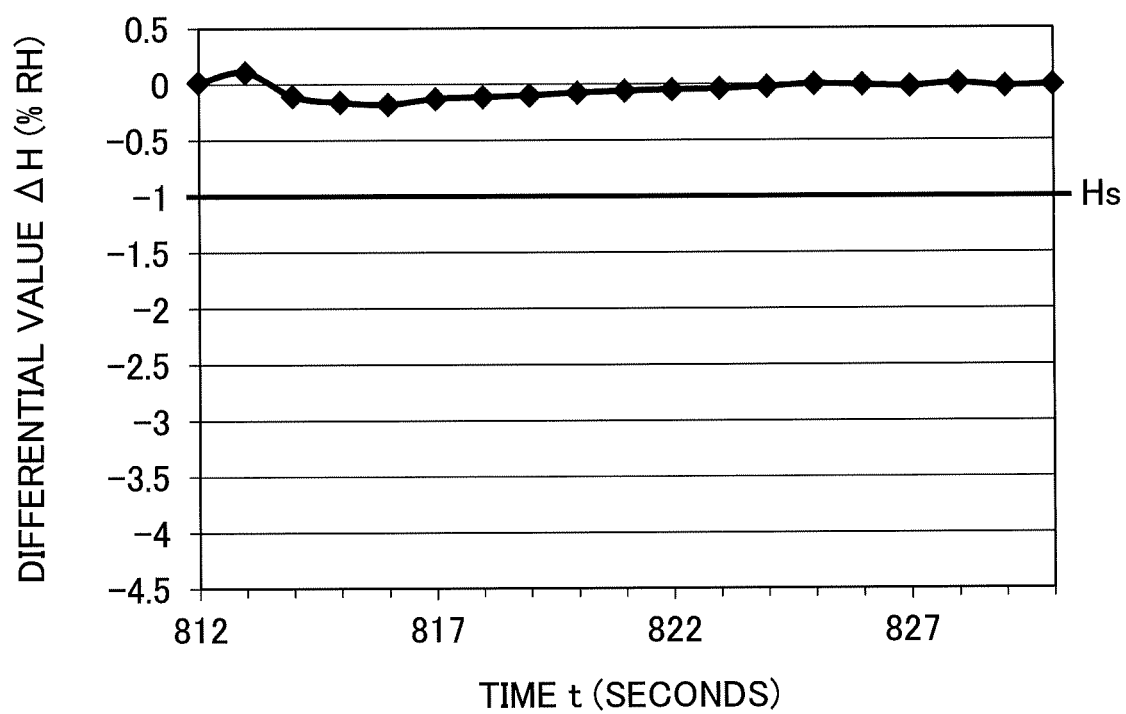
FIG. 19 is a graph illustrating the relationship between a humidity differential value after the start of heating and time.

FIGS. 18A and 18B and FIG. 19 are graphs each illustrating the relationship between a humidity differential value ΔH after the start of heating and time. FIG. 18A illustrates an example in which there is no condensation. FIG. 18B illustrates an example in which foggy condensation is present. FIG. 19 illustrates an example in which condensation in the form of water droplets is present. In FIGS. 18A and 18B and FIG. 19, the time Δt is set to 1 second, and the reference value Hs is set to "−1% RH".

As illustrated in FIG. 18A, when there is no condensation, humidity H1 rapidly decreases after the start of heating. Therefore, the number of consecutive times the differential value ΔH between humidity levels obtained at two consecutive times becomes greater than or equal to the reference value Hs is small. In the example illustrated in FIG. 18A, the number of times is two.

Conversely, as illustrated in FIG. 18B, when (foggy) condensation has formed, a decrease in humidity H1 after the start of heating is slow. Therefore, the number of consecutive times the differential value ΔH becomes greater than or equal to the reference value Hs is large. In the example of FIG. 18B, the number of times is 4. Further, as illustrated in FIG. 19, when condensation (in the form of water droplets) has formed, a decrease in humidity H1 after the start of heating is much slower. Therefore, the number of consecutive times the differential value ΔH becomes greater than or equal to the reference value Hs is many.

Accordingly, in the examples illustrated in FIGS. 18A and 18B and FIG. 19, the presence of condensation can be determined by determining whether the number of consecutive times the differential value ΔH becomes greater than or equal to the reference value Hs is 3 or more. Note that the number of times, based on which the determination is made, is not limited to 3, and may be appropriately changed. Further, the amount of water droplets (condensed water droplets) adhering to the detection surface can be estimated based on the number of consecutive times the differential value ΔH becomes greater than or equal to the reference value Hs after the start of heating.

<Preliminary Determination Process>

Further, in the above-described first embodiment, the first threshold $H_{TH1}$ is set to a fixed value (100% RH) in the preliminary determination process for determining whether the temperature has reached the dew point. However, considering that the temperature may change during the determination process, it may be preferable to change the first threshold $H_{TH1}$ in accordance with the temperature measured by the temperature measuring processor 32. The same applies to the first threshold $H_{TH1}$ used in the condensation removal determination process.

Specifically, in order to perform the preliminary determination process in an environment of N ° C., data indicating the relationship between temperature and humidity corresponding to a dew point of N ° C. is preliminarily stored. Then, the first threshold $H_{TH1}$ is set to humidity corresponding to the temperature measured by the temperature measuring processor 32.

The dew point is the temperature at which the water vapor in the air becomes saturated (the temperature at which the relative humidity becomes 100% RH). The dew point of N ° C. means that the dew point is N ° C.

Figure 20:
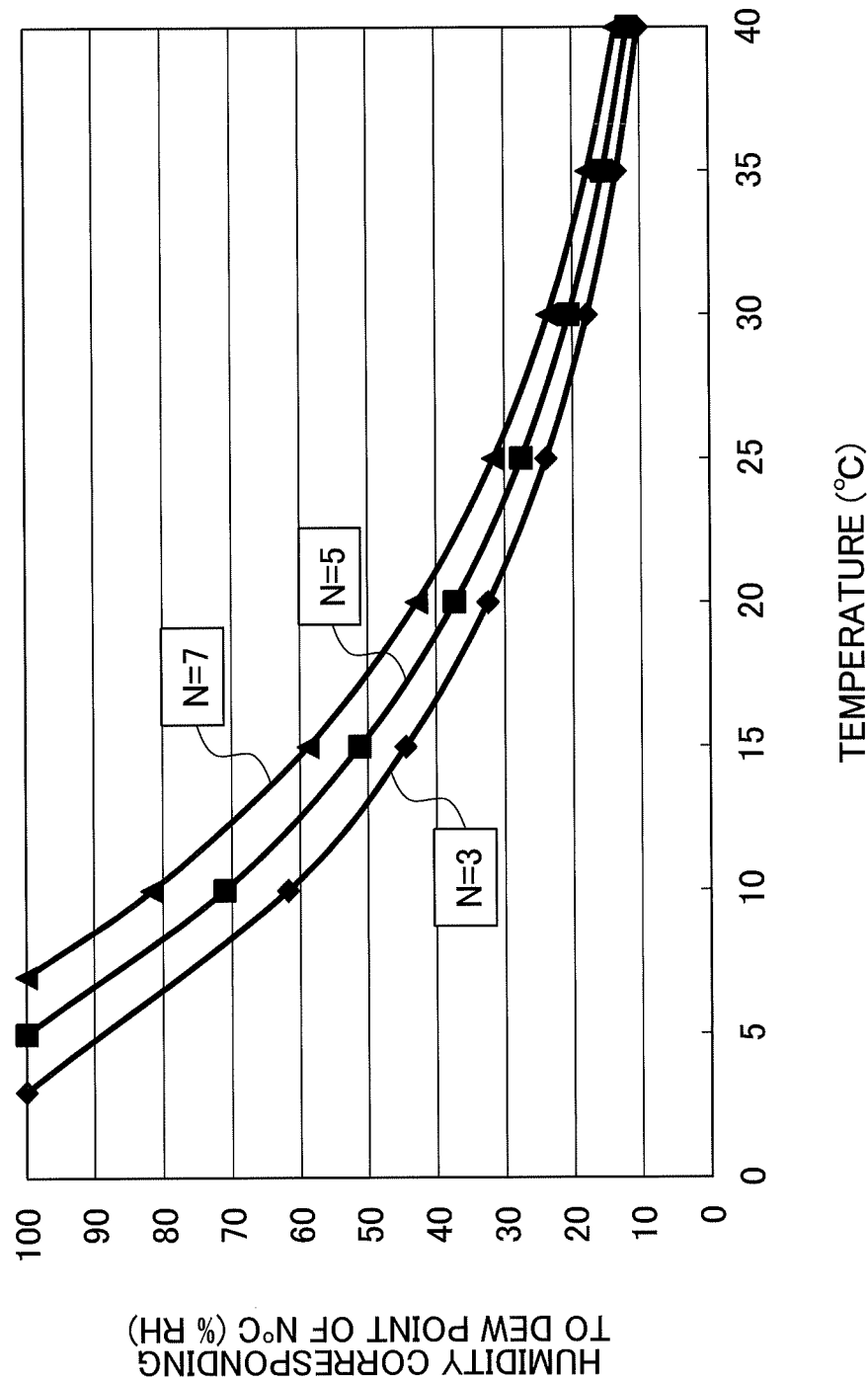
FIG. 20 is a graph illustrating the relationship between temperature and humidity corresponding to a dew point of N° C.

FIG. 20 is a graph illustrating the relationship between temperature and humidity corresponding to a dew point of N ° C. For example, when the temperature is 10° C., humidity corresponding to a dew point of 5° C. is 71% RH. Therefore, the first threshold $H_{TH1}$ may be set to 71% RH.

The data indicating the relationship between temperature and humidity corresponding to a dew point of N ° C. can be obtained based on the following formula (1) for calculating the saturation vapor pressure E (unit: hPa).

$$E=(\exp(-6096.9385\times(T+273.15)^{-1}+21.2409642-2.711193\times10^{-2}\times(T+273.15)+1.673952\times10^{-5}\times(T+273.15)^2+2.433502\times\ln(T+273.15)))/100 \quad (1)$$

The formula (1) is known as Sonntag's formula. In the formula (1), T represents degrees Celsius.

For example, when T=5° C., E=8.72 hPa. When T=25° C., E=31.67 hPa. Therefore, when the temperature T is 25° C., humidity corresponding to a dew point of 5° C. is calculated as 8.72/31.67×100=27.53% RH.

<Condensation Removal Determination Process>

Next, a variation of the condensation removal determination process will be described.

Figure 21:
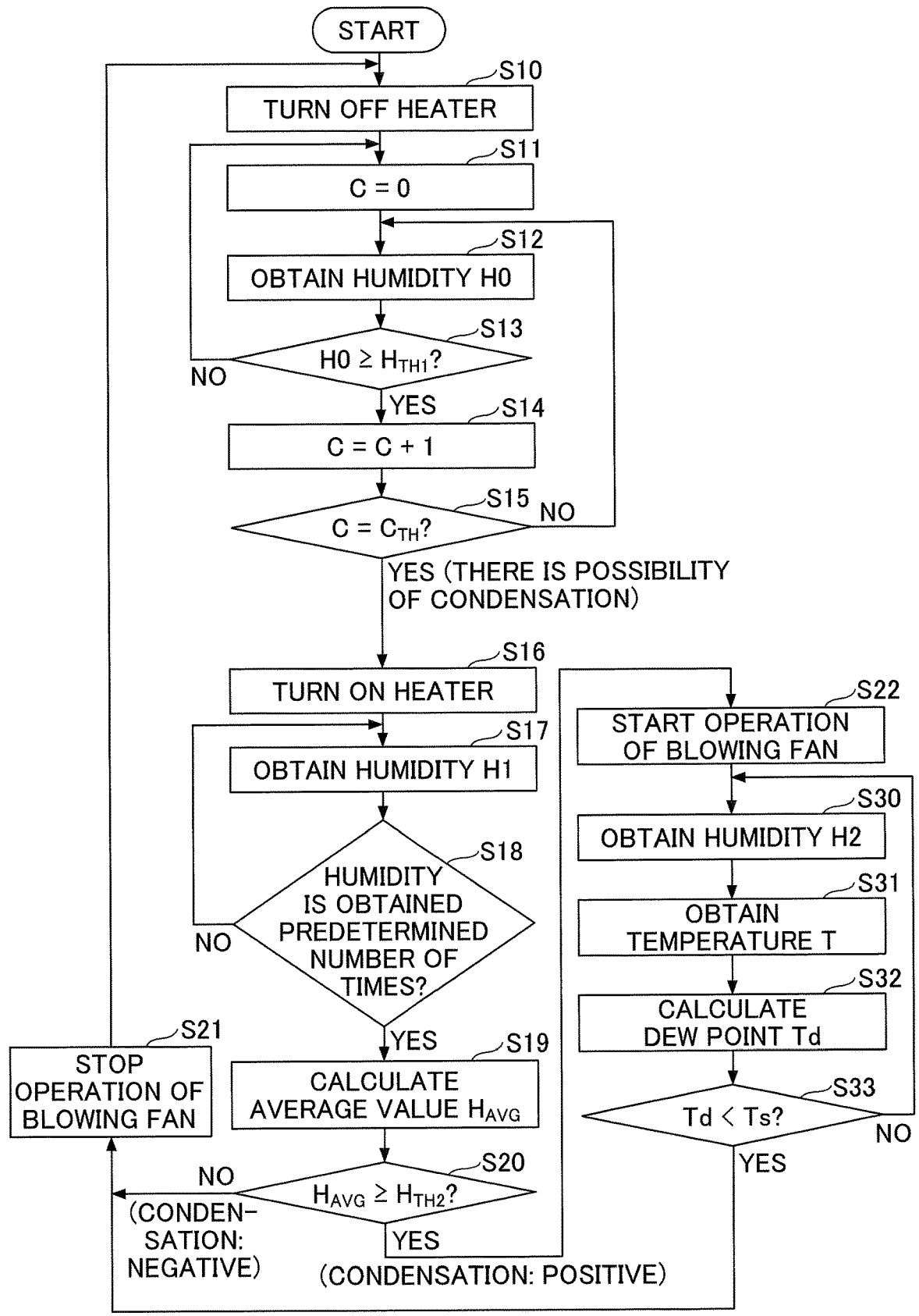
FIG. 21 is a flowchart illustrating a process including a condensation removal determination process according to a variation.

FIG. 21 is a flowchart illustrating a process including the condensation removal determination process according to the variation. The flowchart illustrated in FIG. 21 differs from the flowchart illustrated in FIG. 14, only in that steps S30 through S33 are applied instead of steps S22 through S25.

In the present variation, when the moisture determining unit 63 determines that condensation has formed, and the moisture determining unit 63 causes the moisture removal control unit 64 to start the operation of the blowing fan 4 (step S22), the moisture determining unit 63 obtains humidity H2 measured by the humidity measuring processor 31 while the heater 23 is turned on (step S30). Further, the moisture determining unit 63 obtains a temperature T measured by the temperature measuring processor 32 (step S31).

Next, the moisture determining unit 63 calculates a dew point Td based on the obtained humidity H2 and the obtained temperature T (step S32). The dew point Td is calculated based on data such as data indicating the relationship between the amount of water vapor at saturation and temperature, and data indicating the relationship between the saturation vapor pressure and temperature.

Then, the moisture determining unit 63 compares the calculated dew point Td to a reference temperature Ts (step S33). When the dew point Td is not less than the reference temperature Ts (no in S33), the moisture determining unit 63 determines that condensation is not removed, and the process returns to step S30. Conversely, when the dew point Td is less than the reference temperature Ts (yes in S33), the moisture determining unit 63 determines that condensation is removed, and the process proceeds to step S21. Then, the moisture determining unit 63 causes the moisture removal control unit 64 to stop the operation of the blowing fan 4. The reference temperature Ts may be 5° C., for example.

Accordingly, the removal determination process is performed based on the dew point while the heater 23 is being turned on, thereby increasing the determination speed and allowing the operation of the blowing fan 4 to be stopped in a short period of time. By performing the removal determination process while the heater 23 is being turned on, water droplets adhering to the detection surface of the sensor chip 20 disappear in a short period of time. Thus, the removal determination process can be performed with no water droplets adhering to the detection surface.

<Process for Estimating Amount of Condensation>

Next, a process for estimating the amount of water droplets (condensed water droplets) adhering to the detection surface of the sensor chip 20 will be described.

Figure 22:
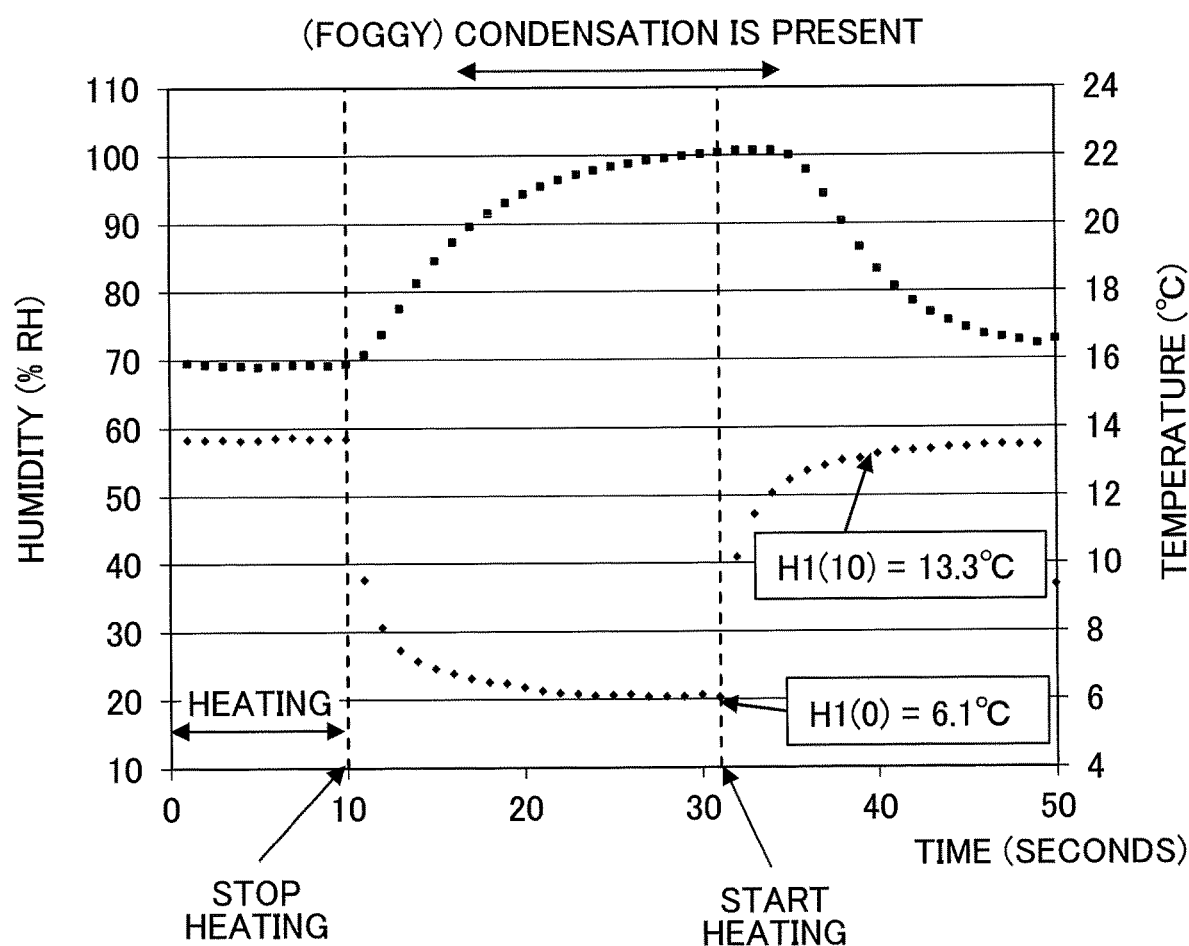
FIG. 22 is a graph illustrating changes in humidity and temperature when heating is started in an environment where foggy condensation is present.

FIG. 22 is a graph illustrating changes in humidity and temperature when heating is started in an environment where foggy condensation is present. More specifically, FIG. 22 illustrates changes in humidity and temperature with stopping heating of the heater 23 after heating the sensor chip 20, and subsequently, the heater 23 starting to heat the sensor chip 20 again after foggy condensation has formed on the detection surface of the sensor chip 20.

The amount of condensation can be estimated by comparing the amount of temperature change before and after the start of heating when condensation has formed, to the amount of temperature change before and after the start of heating when there is no condensation.

Figure 23:
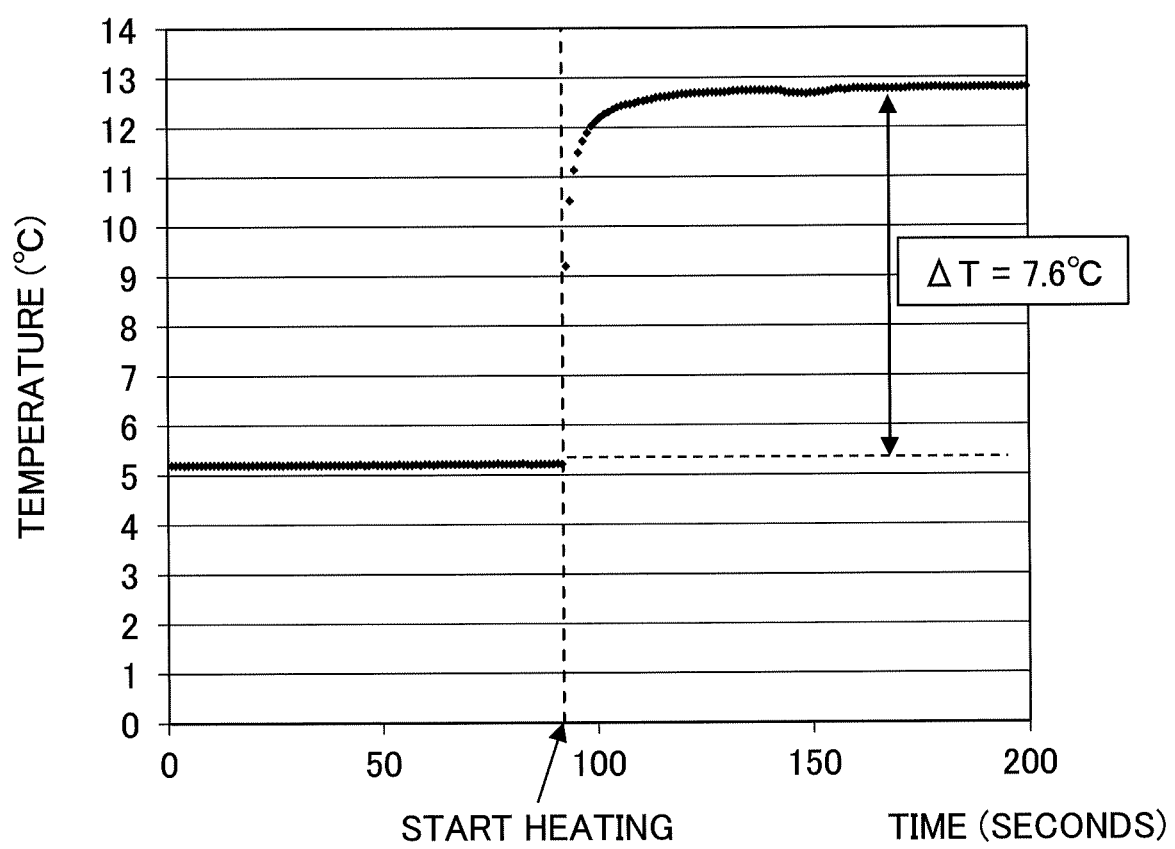
FIG. 23 is a graph illustrating the amount of temperature change of the sensor chip when heating is started in an environment where there is no condensation.

FIG. 23 is a graph illustrating the amount of temperature change of the sensor chip 20 when heating is started in an environment where there is no condensation. In the example of FIG. 23, the amount of temperature change ΔT is approximately 7.6° C.

As illustrated in FIG. 22, in an environment where foggy condensation has formed, the temperature T(0) immediately before the start of heating is approximately 6.1° C., the temperature T(t) 10 seconds after the start of heating is approximately 13.3° C., and the amount of temperature change (T(t)−T(0)) is approximately 7.2° C. T(t) represents the temperature of the sensor chip 20 measured when a certain period of time t has elapsed after the start of heating.

The amount of temperature change over the certain period of time t after the start of heating depends on the amount of condensation. As the amount of condensation decreases, the amount of temperature change increases and approaches the above-described amount of temperature change ΔT. Therefore, the amount of condensation can be estimated by calculating a coefficient (hereinafter referred to as a temperature change coefficient Y) expressed by the following formula (2).

$$Y = \Delta T/(T(t)-T(0))-1 \quad (2)$$

FIG. 24 is a table illustrating the relationship between the amount of condensation and the temperature change coefficient Y. The table in FIG. 24 indicates the results of an experiment using different amounts of condensation, in which the temperature change coefficient Y is calculated, with ΔT being 7.6° C. As can be seen from FIG. 24, the amount of condensation decreases as the temperature change coefficient Y approaches 0.

Figure 25:
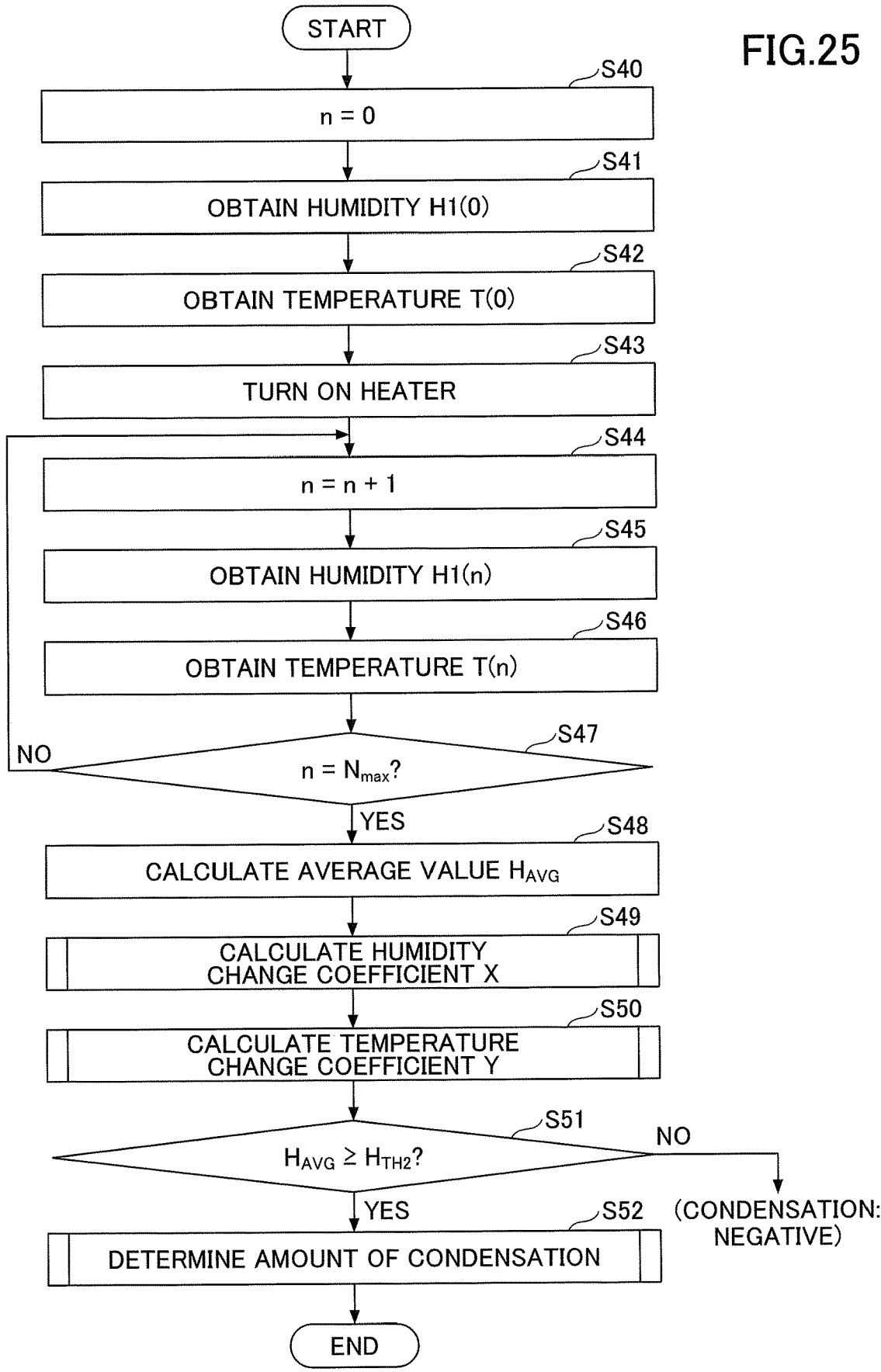
FIG. 25 is a flowchart illustrating a process for estimating the amount of condensation performed together with the condensation determination process.

Next, a specific example in which the process for estimating the amount of condensation is performed together with a condensation determination process as described above will be described. FIG. 25 is a flowchart illustrating the process for estimating the amount of condensation performed together with the condensation determination process. In the process for estimating the amount of condensation illustrated in FIG. 25, in addition to the temperature change coefficient Y, a humidity change coefficient X that indicates a decrease in humidity after the start of heating is used to estimate the amount of condensation. In the flowchart illustrated in FIG. 25, the preliminary determination process and the condensation removal determination process described in the above embodiment are omitted.

First, the moisture determining unit 63 turns off the heater 23, and sets a counter value n to "0" (step S40). Then, the moisture determining unit 63 obtains humidity H1(0) measured by the humidity measuring processor 31 (step S41), and obtains temperature T(0) measured by the temperature measuring processor 32 (step S42). The moisture determining unit 63 stores the obtained humidity H1(0) and the obtained temperature T(0) in the storage device as initial values.

Next, the moisture determining unit 63 turns on the heater 23 (step S43), and adds "1" to the counter value n (step S44). Then, the moisture determining unit 63 obtains humidity H1(n) measured by the humidity measuring processor 31 (step S45), and obtains temperature T(n) measured by the temperature measuring processor 32 (step S46). The moisture determining unit 63 stores the obtained humidity H1(n) and the obtained temperature T(n) in the storage device.

Next, the moisture determining unit 63 determines whether the counter value n is equal to a maximum value $N_{max}$ (step S47). The maximum value $N_{max}$ is, for example, "15". When the moisture determining unit 63 determines that the counter value n is not equal to the maximum value $N_{max}$ (no in step S47), the process returns to step S44. Then, the moisture determining unit 63 causes the counter value to be incremented, and obtains humidity H1(n) and temperature T(n) again. Humidity H1(n) and temperature T(n) may be obtained at intervals of 1 second, for example.

When the moisture determining unit 63 determines that the counter value n is equal to the maximum value $N_{max}$ (yes in step S47), the moisture determining unit 63 calculates an average value $H_{AVG}$ of humidity H1(n) stored in the storage device (step S48). The average value $H_{AVG}$ is calculated by the following formula (3).

$$H_{AVG} = ((1)+H1(2)+ \ldots +H1(N_{max})/N_{max} \quad (3)$$

Next, the moisture determining unit 63 calculates the humidity change coefficient X based on the humidity H1(n) stored in the storage device (step S49). The humidity change coefficient X represents the number of consecutive times a differential value ΔH between humidity levels becomes greater than or equal to the reference value Hs, after the start of heating. A process for calculating the humidity change coefficient X will be described later.

Next, the moisture determining unit 63 calculates the temperature change coefficient Y based on the temperature T(n) stored in the storage device and also the above-described amount of temperature change ΔT preliminarily stored in the storage device (step S50). A process for calculating the temperature change coefficient Y will be described later.

Next, similar to the above-described embodiment, the moisture determining unit 63 determines whether the average value $H_{AVG}$ is greater than or equal to the second threshold $H_{TH2}$ (step S51). When the average value $H_{AVG}$ is less than the second threshold $H_{TH2}$ (no in step S51), the moisture determining unit 63 determines that there is no condensation (the presence of condensation is negative). Conversely, when the average value $H_{AVG}$ is greater than or equal to the second threshold $H_{TH2}$ (yes in step S51), the moisture determining unit 63 determines that condensation has formed (the presence of condensation is positive), and the process proceeds to step S52.

In step S52, the moisture determining unit uses the humidity change coefficient X and the temperature change coefficient Y to determine the amount of condensation on the detection surface.

Figure 26:
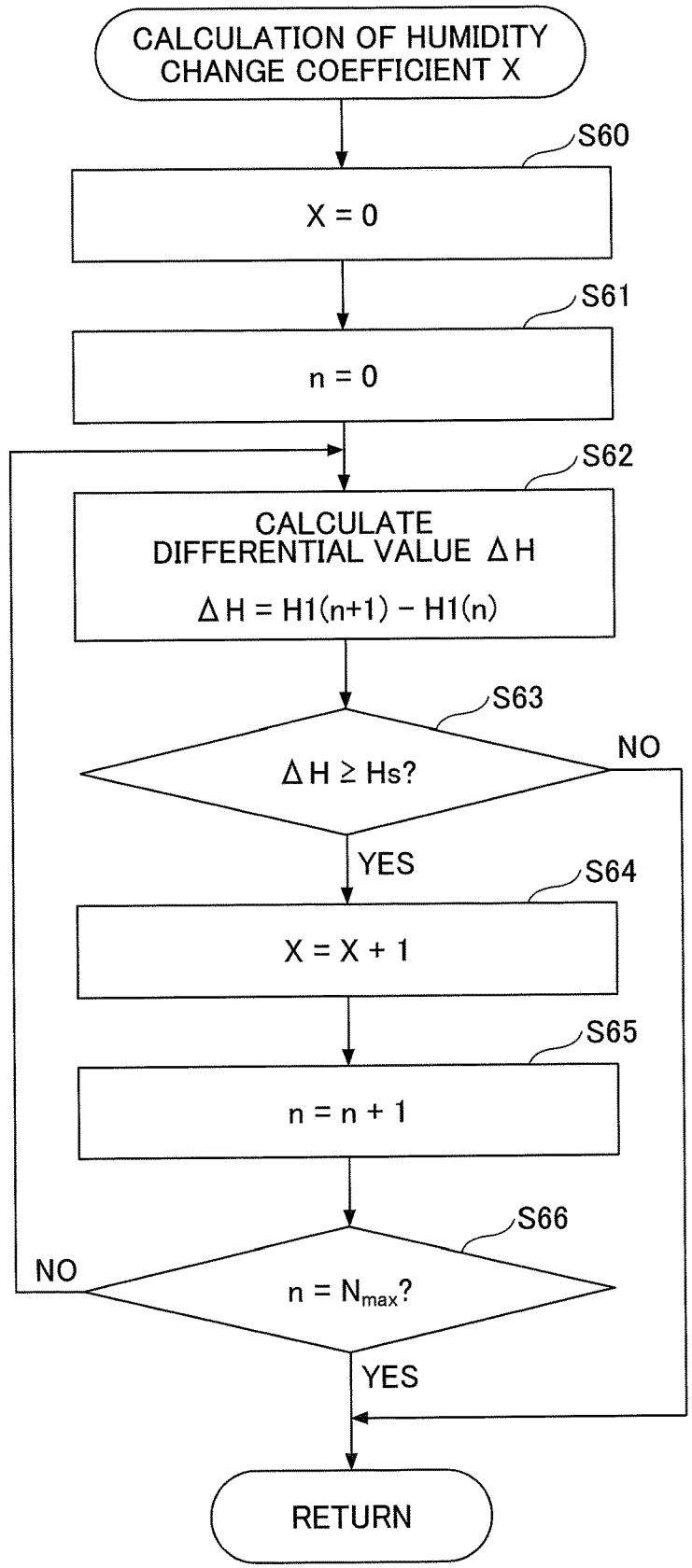
FIG. 26 is a flowchart illustrating a process for calculating a humidity change coefficient.

FIG. 26 is a flowchart illustrating the process for calculating the humidity change coefficient X. When the moisture determining unit 63 calculates the humidity change coefficient X in step S49 above, the moisture determining unit 63 first sets both a counter value X and a counter value n to "0" (step S60 and step S61).

Next, the moisture determining unit 63 calculates the differential value ΔH based on the humidity H1(n) stored in the storage device (step S62). The differential value/H is expressed by the following formula (4).

$$\Delta H = H1(n+1) - H1(n) \quad (4)$$

The moisture determining unit 63 determines whether the calculated differential value ΔH is greater than or equal to the reference value Hs (step S63). When the moisture determining unit determines that the differential value ΔH is greater than or equal to the reference value Hs (yes in step S63), the moisture determining unit 63 adds "1" to the counter value X and the counter value n (step S64 and step S65), and determines whether the counter value n is equal to the above-described maximum value $N_{max}$ (step S66). When the moisture determining unit 63 determines that the counter value n is not equal to the above-described maximum value $N_{max}$ (no in step S63), the moisture determining unit 63 causes the process to return to step S62, and calculates the differential value ΔH again.

Conversely, when the moisture determining unit 63 determines that the counter value n is equal to the maximum value $N_{max}$ the moisture determining unit 63 stores the counter value X ($=N_{max}$) in the storage device, and ends the process. Further, when the moisture determining unit 63 determines that the differential value ΔH is less than the reference value Hs (no in step S63), the moisture determining unit 63 stores, in the storage device, the counter value X at that time, and ends the process.

As described above, the counter value X stored in the storage device is the humidity change coefficient X indicating the number of consecutive times the differential value ΔH becomes greater than or equal to the reference value Hs.

Figure 27:
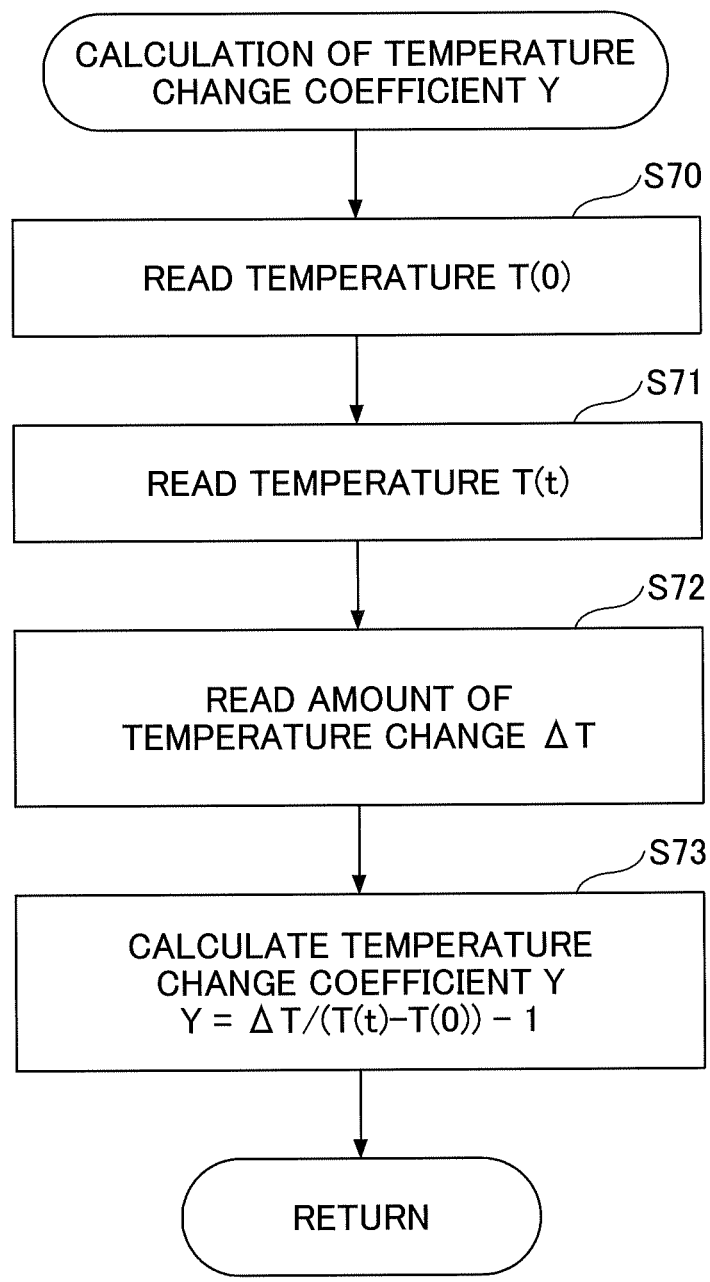
FIG. 27 is a flowchart illustrating a process for calculating the temperature change coefficient.

FIG. 27 is a flowchart illustrating the process for calculating the temperature change coefficient Y. When the moisture determining unit calculates the temperature change coefficient Y in step S50 above, the moisture determining unit 63 first reads the temperature T(0), stored as the initial value, from the storage device (step S70). Next, the moisture determining unit 63 reads the temperature T(t) measured when the certain period of time t has elapsed after the start of heating in step S43 (step S71). For example, when t=10, the moisture determining unit 63 reads the temperature T(10) measured when 10 seconds have elapsed after the start of heating.

Further, the moisture determining unit 63 reads the amount of temperature change ΔT with no condensation, which is preliminarily stored in the storage device (step S72). Next, the moisture determining unit 63 calculates the temperature change coefficient Y based on the above formula (2) (step S73).

Figure 28:
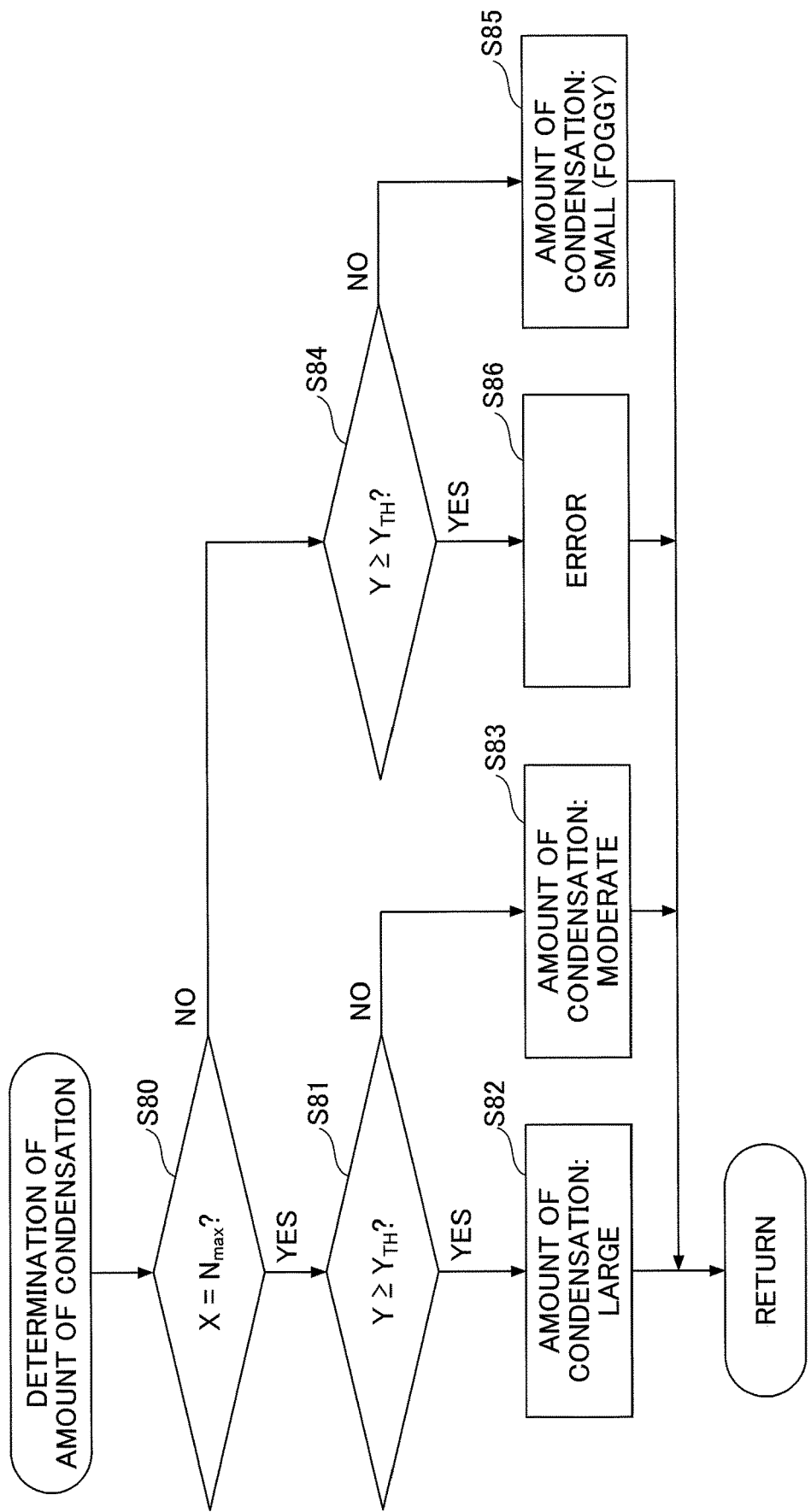
FIG. 28 is a flowchart illustrating a process for determining the amount of condensation.

FIG. 28 is a flowchart illustrating a process for determining the amount of condensation. First, the moisture determining unit 63 determines whether the humidity change coefficient X is equal to a maximum value $N_{max}$ (step S80).

When the moisture determining unit 63 determines that the humidity change coefficient X is equal to the maximum value $N_{max}$ (yes in step S80), the moisture determining unit 63 determines whether the temperature change coefficient Y is greater than or equal to a threshold $Y_{TH}$ (step S81). The threshold $Y_{TH}$ may be 0.08, for example.

When the moisture determining unit 63 determines that the temperature change coefficient Y is greater than or equal to the threshold $Y_{TH}$ (yes in step S81), the moisture determining unit 63 determines that the amount of condensation is large (step S82). When the moisture determining unit 63 determines that the temperature change coefficient Y is less than the threshold $Y_{TH}$ (no in step S81), the moisture determining unit 63 determines that the amount of condensation is moderate (step S83).

When the moisture determining unit 63 determines that the humidity change coefficient X is not equal to the maximum value $N_{max}$ (no in step S80), the moisture determining unit 63 determines whether the temperature change coefficient Y is greater than or equal to the threshold $Y_{TH}$ (step S84). Similar to step S81, the threshold $Y_{TH}$ may be 0.08, for example.

When the moisture determining unit 63 determines that the temperature change coefficient Y is less than the threshold $Y_{TH}$ (no in step S84), the moisture determining unit 63 determines that the amount of condensation is small (foggy condensation) (step S85). When the moisture determining unit 63 determines that the temperature change coefficient Y is greater than or equal to the threshold $Y_{TH}$ (yes in step S84), the moisture determining unit 63 determines that there is an error (step S86).

In other words, the moisture determining unit 63 estimates that the larger the number of consecutive times the differential value ΔH becomes greater than or equal to the reference value Hs is, and also the smaller the amount of temperature change (T(t)−T(0)) is, the larger the amount of condensation becomes.

If only the humidity change coefficient X were to be used, it would be difficult to accurately estimate the amount of condensation. Conversely, in the above-described determination process, the amount of condensation can be more accurately estimated because both the temperature change coefficient Y and the humidity change coefficient X are used. Note that the moisture determining unit may use the humidity change coefficient X only without using the temperature change coefficient Y to determine the amount of condensation. The present disclosure is not intended to eliminate a determination method using the humidity change coefficient X only.

Further, the order of steps illustrated in each of the above-described flowcharts may be changed as long as no contradiction occurs.

<Preliminary Determination Process>

Figure 29:
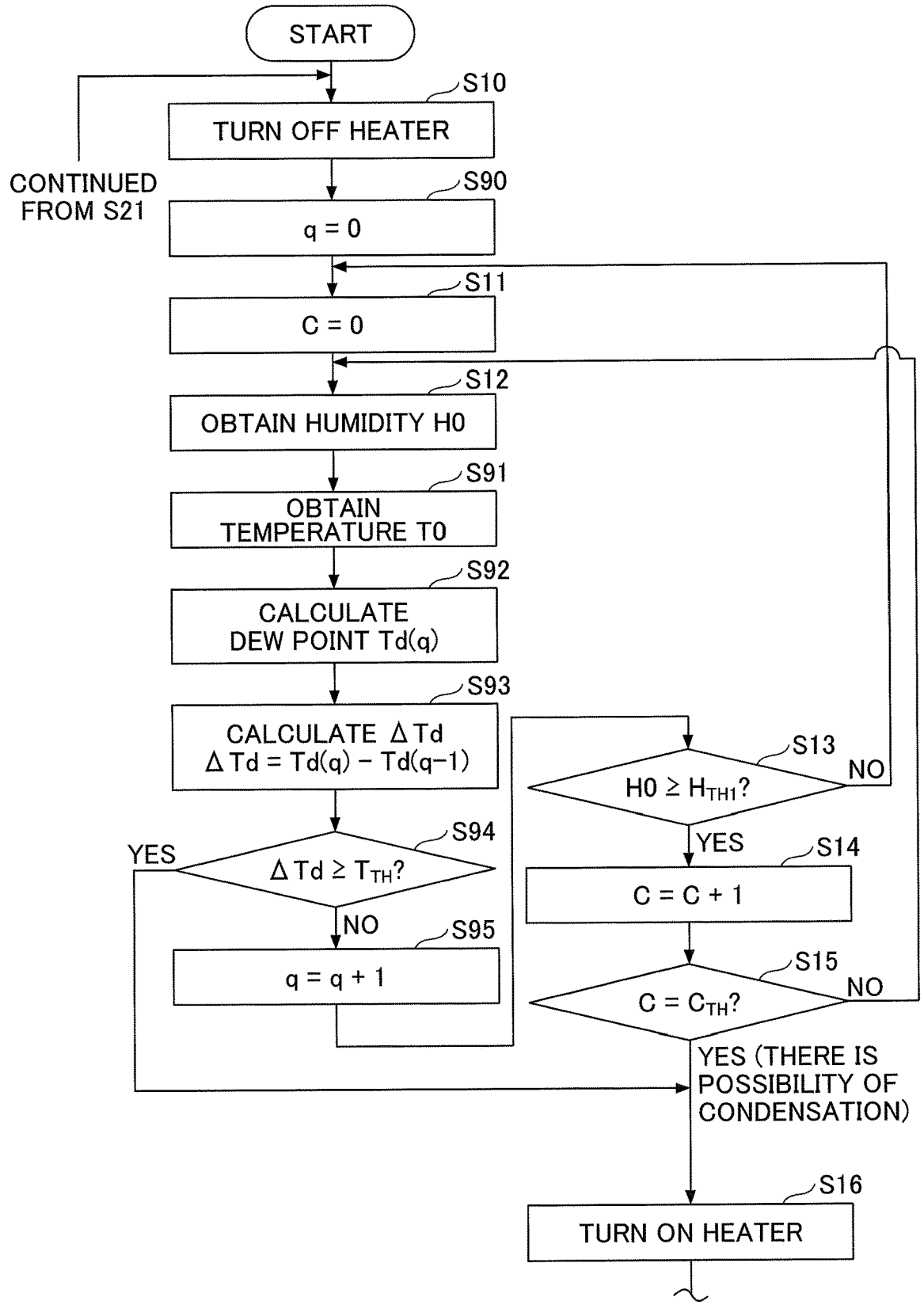
FIG. 29 is a flowchart illustrating a variation of the preliminary determination process according to the first embodiment of the present invention.

Next, a variation of the preliminary determination process will be described. FIG. 29 is a flowchart illustrating the variation of the preliminary determination process. In the present variation, steps S90 through S95 are added to the flowchart illustrated in FIG. 14 or to the flowchart illustrated in FIG. 21.

As illustrated in FIG. 29, in the present variation, after step S10, the moisture determining unit 63 sets a counter value q to "0" (Step S90). After humidity H0 is obtained in step S12, the moisture determining unit 63 obtains a temperature T0 measured by the temperature measuring processor (step S91).

Next, the moisture determining unit 63 calculates a dew point Td(q) based on the obtained humidity H0 and the obtained temperature T0 (step S92). The moisture determining unit 63 stores the calculated dew point Td(q) in the storage device. The calculation of the dew point Td(q) is performed in the same manner as in step S32 of FIG. 21. The moisture determining unit 63 uses the dew point Td(q) and a dew point Td(q−1) stored in the storage device to calculate a differential value ΔTd (step S93). The differential value ΔTd is expressed by the following formula (5).

$$\Delta Td = Td(q) - Td(q-1) \tag{5}$$

In the above formula (5), Td(q−1) represents a dew point calculated at the previous time in step S92. If there is no dew point calculated at the previous time, steps S93 and S94 may be skipped, and the process may proceed to step S95. Alternatively, if there is no dew point calculated at the previous time, an initial value preliminarily stored in the storage device may be used.

Next, the moisture determining unit 63 compares the calculated difference ΔTd to a threshold $T_{TH}$ (step S94). When it is determined that the differential value ΔTd is less than the threshold $T_{TH}$ (no in step S94), the moisture determining unit 63 adds "1" to the counter value q (step S95), and the process proceeds to step S13. Conversely, when it is determined that the differential value ΔTd is greater than or equal to the threshold $T_{TH}$, the moisture determining unit 63 estimates that there is a possibility of condensation, and the process proceeds to step S16. The threshold $T_{TH}$ may be 1.5° C., for example. It is preferable to set the threshold $T_{TH}$ to an appropriate value in accordance with the application. This is because if the threshold $T_{TH}$ is too small, the possibility of incorrect determination would become high, and if the threshold $T_{TH}$ is too large, the determination would not work. It may be preferable to set the threshold $T_{TH}$ by using an assumed ambient temperature as a parameter.

As described above, by adding the steps of estimating the possibility of condensation based on a change in dew point to the preliminary determination process, it is possible to estimate the possibility of condensation even when a rapid humidity change occurs at a similar temperature. This makes it possible to quickly detect the presence of foggy water droplets and water submersion.

<Other Variations>

In the sensor module 10, the recessed opening 50 is formed through the molded resin 40 so as to expose the detection surface. Thus, condensation tends to collect on the detection surface, enabling early detection of condensation.

Figure 30:
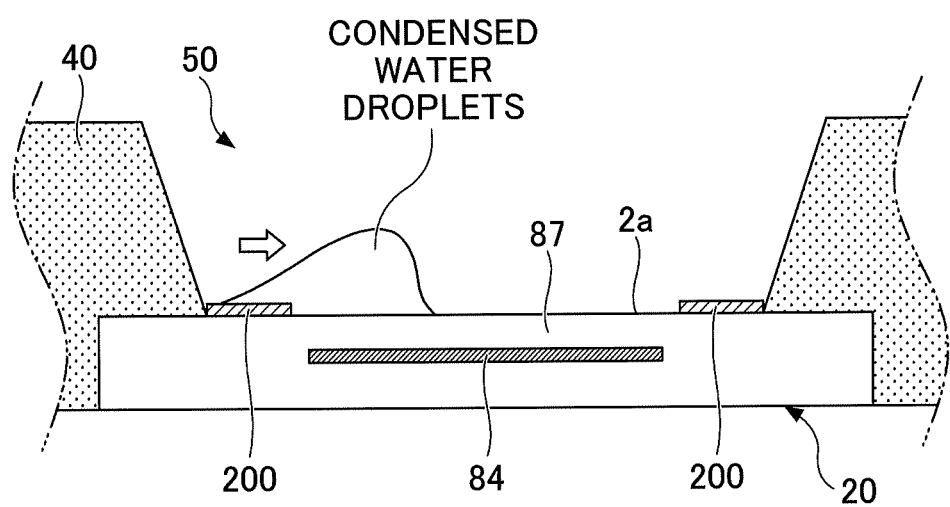
FIG. 30 is a diagram illustrating a sensor chip including a water-repellent film formed on the detection surface.

Further, in order to facilitate early detection of condensation, a water-repellent film 200 having water repellency may be formed on the periphery of a detection surface 2a of the sensor chip 20 within the opening 50 as illustrated in FIG. 30. The water-repellent film 200 is preferably formed outwardly relative to the upper electrode 84. The water-repellent film 200 may be any film formed of a material having higher water repellency than that of the overcoat film 87. As described above, by providing the water-repellent film 200, condensation tends to collect on the detection surface 2a, thereby improving condensation detection sensitivity.

In the above-described embodiment, the reference electrode 82 is provided above the heater in the sensor chip 20; however, the reference electrode 82 is not necessarily provided above the heater 23.

Further, in the above-described embodiment, the p-type semiconductor substrate 70 is used as a semiconductor substrate constituting the sensor chip 20; however, an n-type semiconductor substrate may be used. In this case, the heater 23 may be formed by a p-type diffusion layer. In other words, the heater may be formed by an impurity diffusion layer that is formed by adding impurities to the surface layer of the semiconductor substrate.

Further, in the above-described embodiment, the temperature detector 22 is configured by the npn type bipolar transistors 90; however, the temperature detector 22 may be configured by pnp type bipolar transistors.

Further, in the above-described embodiment, the humidity detecting capacitor 80 of the sensor chip 20 has a parallel-plate-type electrode structure. However, instead of the parallel-plate-type electrode structure, a comb-tooth type electrode structure may be used. The sensor chip may be a temperature/humidity sensor that includes a heater (heating unit).

Further, in the present disclosure, the positional relationship between two elements, represented by terms such as "cover" and "on", includes both cases in which a first element is indirectly disposed on the surface of a second element via another element and in which the first element is directly disposed on the second element.

Further, in the above-described embodiment, condensation is removed by the blowing fan. However, any condensation remover other than the blowing fan, such as a condensation remover that removes condensation by rotating a magnetic disk in a HDD drive or a condensation remover that removes condensation by air blowing, may be employed.

Further, in the above-described embodiment, the temperature detector 22 is included in the sensor chip 20. However, the temperature detector may be included in the ASIC chip 30, and the temperature detector included in the ASIC chip 30 may detect a temperature rise caused by the heater 23.

Second Embodiment

In the following, a second embodiment will be described with reference to the accompanying drawings. The second embodiment differs from the first embodiment in that frost is detected in addition to condensation. In the following second embodiment, only differences from the first embodiment will be described. Elements having the same functional configurations as the first embodiment are referred to by the same reference numerals used in the first embodiment, and thus a description thereof will be omitted.

Figure 31:
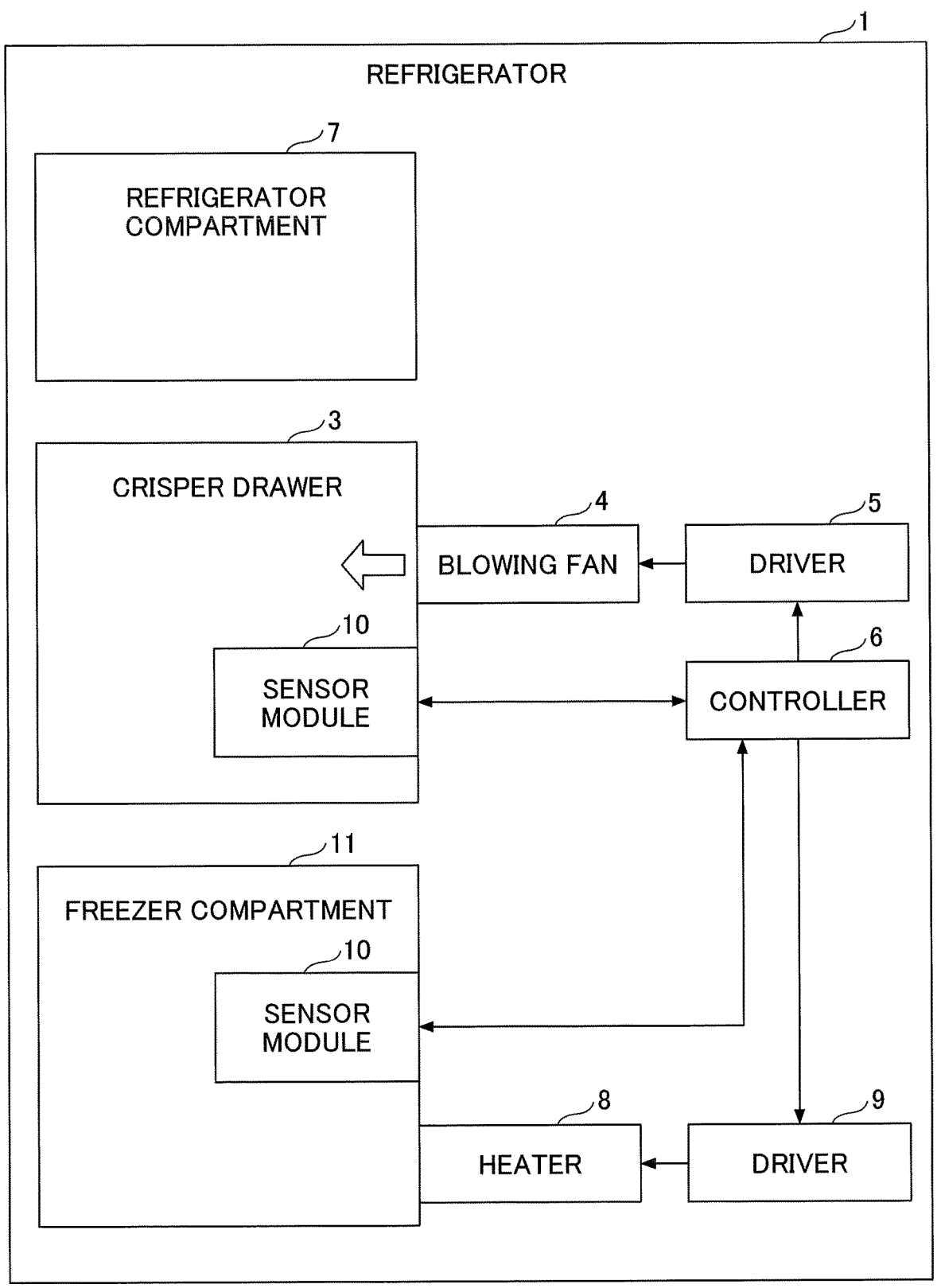
FIG. 31 is a schematic view of the overall configuration of a refrigerator according to a second embodiment of the present invention.

FIG. 31 is a schematic view of the overall configuration of a refrigerator according to the second embodiment of the present invention.

A refrigerator 1 according to the second embodiment further includes a freezer compartment 11. The sensor module 10 is installed on the wall surface of the freezer compartment 11.

The refrigerator 1 according to the second embodiment uses the sensor module 10 to detect frost forming in the freezer compartment 11, in addition to condensation forming in the crisper drawer 3.

The controller 6 determines whether frost has formed in the freezer compartment 11, in addition to determining whether condensation has formed in the crisper drawer 3. When it is determined that frost has formed in the freezer compartment 11, the controller 6 controls the driver 5 to operate a heater 8.

The heater 8 is driven by the driver 5 to heat the inside of the freezer compartment 11 and melt frost. The heater 8 functions as a moisture remover that removes moisture formed in the freezer compartment 11.

The moisture determining unit 63 of the controller 6 according to the second embodiment determines whether condensation or frost has formed. Specifically, the moisture determining unit 63 performs a moisture determination process, which is similar to the condensation determination process illustrated in FIG. 14 or FIG. 21, and determines whether moisture such as condensation or frost has formed.

In the moisture determination process, when a temperature T0, which is a temperature when the heater 23 is turned off, is 0° C. or more, the moisture determining unit 63 determines whether condensation has formed, and when the temperature T0 is less than 0° C., the moisture determining unit 63 determines whether frost has formed.

Further, when the moisture determining unit 63 determines that condensation has formed, the moisture removal control unit 64 of the controller 6 according to the second embodiment controls the driver 5 to operate the blowing fan 4. When the moisture determining unit 63 determines that frost has formed, the moisture removal control unit 64 of the controller 6 controls a driver 9 to operate the heater 8.

Further, the moisture removal control unit 64 performs a moisture removal determination process, which is similar to the condensation removal determination process illustrated in FIG. 14 or FIG. 21, and ensures the removal of moisture such as condensation or frost.

Further, in the second embodiment, in the preliminary determination process, it may be determined whether the temperature is equal to the dew point or whether the temperature is equal to the frost point. It is known that the frost point is the temperature at which frost forms, and is below the dew point.

Further, it is preferable to change the first threshold $H_{TH1}$ in accordance with the temperature measured by the temperature measuring processor 32. The same applies to the first threshold $H_{TH1}$ used in the moisture removal determination process.

Specifically, when the preliminary determination process is performed in an environment of N ° C., data indicating the relationship between temperature and humidity corresponding to a dew point of N ° C., and data indicating the relationship between temperature and humidity corresponding to a frost point of N ° C. are preliminarily stored. The first threshold $H_{TH1}$ is set to humidity corresponding to the temperature measured by the temperature measuring processor 32. The frost point of N ° C. means that the frost point is N ° C.

In this case, it may be determined whether to use the data corresponding to the dew point of N ° C. or the data corresponding to the frost point of N ° C. in accordance with the temperature. For example, if the temperature is 0° C. or more, the data corresponding to the dew point of N ° C. may be used, and if the temperature N is below 0° C., the data corresponding to the frost point of N ° C. may be used.

The data indicating the relationship between temperature and humidity corresponding to the frost point of N ° C. can be calculated based on the following formula (6) for calculating saturation vapor pressure E of ice (unit: hPa).

$$E=(\exp(-6024.5282\times(T+273.15)^{-1}+29.32707+1.0613868\times10^{-2}\times(T+273.15)-1.3198825\times10^{-5}\times(T+273.15)^2-0.49382577\times\ln(T+273.15)))/100 \quad (6)$$

The formula (6) is a formula for the saturation vapor pressure of ice, among Sonntag's formulas. In the formula (6), T represents degrees Celsius.

Figure 32:
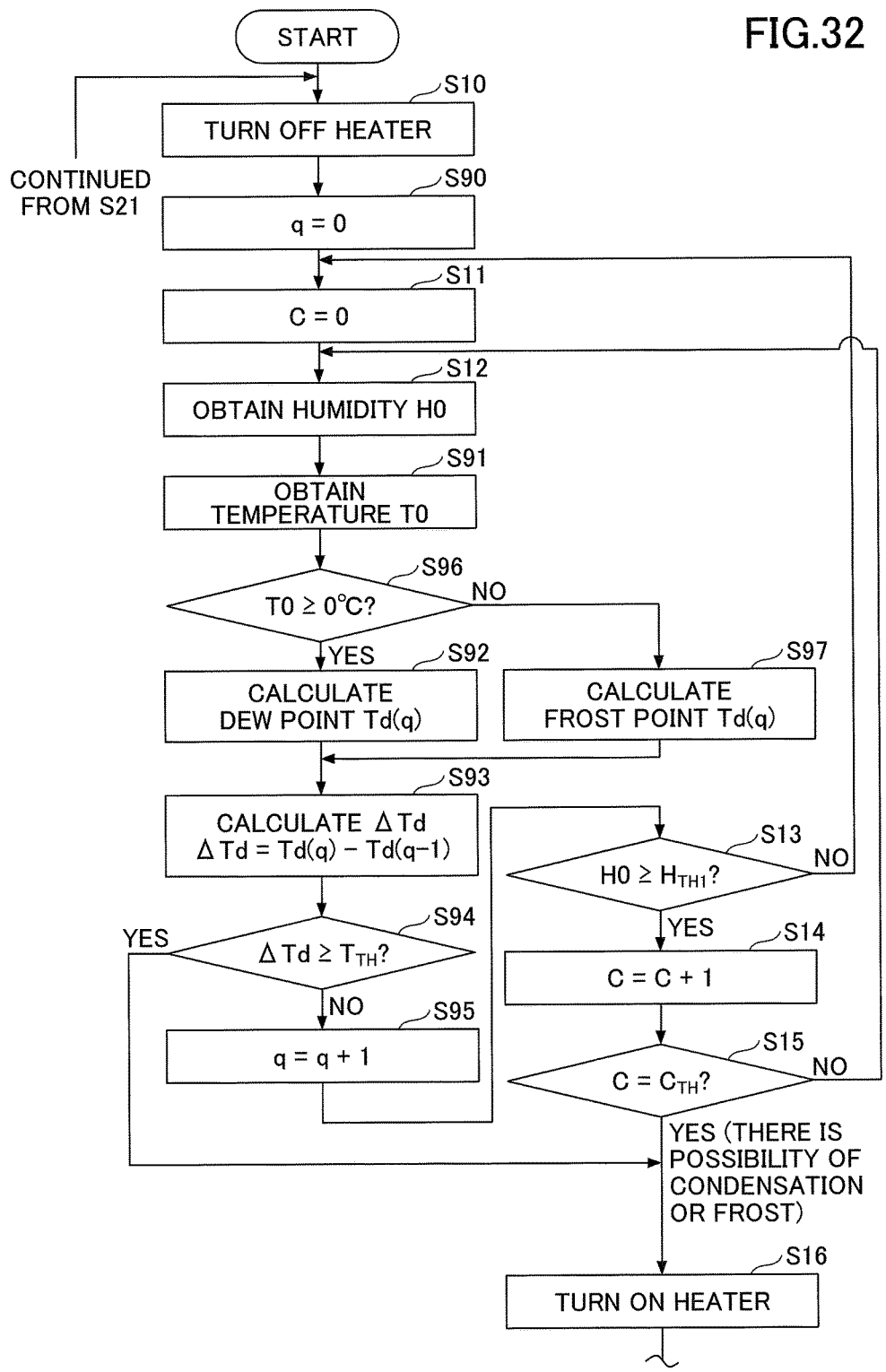
FIG. 32 is a flowchart illustrating a variation of the preliminary determination process according to the second embodiment of the present invention.

Next, a variation of the preliminary determination process according to the second embodiment will be described. FIG. 32 is a flowchart illustrating a variation of the preliminary determination process according to the second embodiment of the present invention. In the present variation, steps S96 and S97 for calculating the frost point are added to the flowchart illustrated in FIG. 29.

As illustrated in FIG. 32, in the present variation, the moisture determining unit 63 determines whether the temperature T0 is 0° C. or more (step S96). When it is determined that the temperature T0 is 0° C. or more (yes in step S96), the moisture determining unit 63 calculates a dew point Td(q) (step S92).

Conversely, when it is determined that the temperature T0 is not 0° C. or more (no in step S96), the moisture determining unit 63 calculates a frost point Td(q) (step S97). Specifically, the moisture determining unit 63 calculates a frost point Td(q) based on the data indicating the relationship between temperature and humidity corresponding to the frost point of N ° C., which has been calculated based on the above-described formula (6).

As described above, the moisture determining unit 63 according to the present variation determines whether there is a possibility of condensation or frost by performing the above-described preliminary determination process.

Note that the threshold $T_{TH}$, which is compared to a differential value ΔTd in step S94, may differ depending on whether the temperature T0 is 0° C. or more, or may be the same regardless of the temperature T0. Further, a temperature other than 0° C. may be used as a boundary temperature to determine whether a different value is set for the threshold $T_{TH}$.

[Experimental Results]

Next, the results of an experiment on humidity changes after the sensor chip 20 starts to be heated will be described. The following results were obtained from the experiment in which a mock environment of the freezer compartment 11 was created by placing the sensor module 10 on a Peltier element and cooling the sensor module 10.

Figure 33:
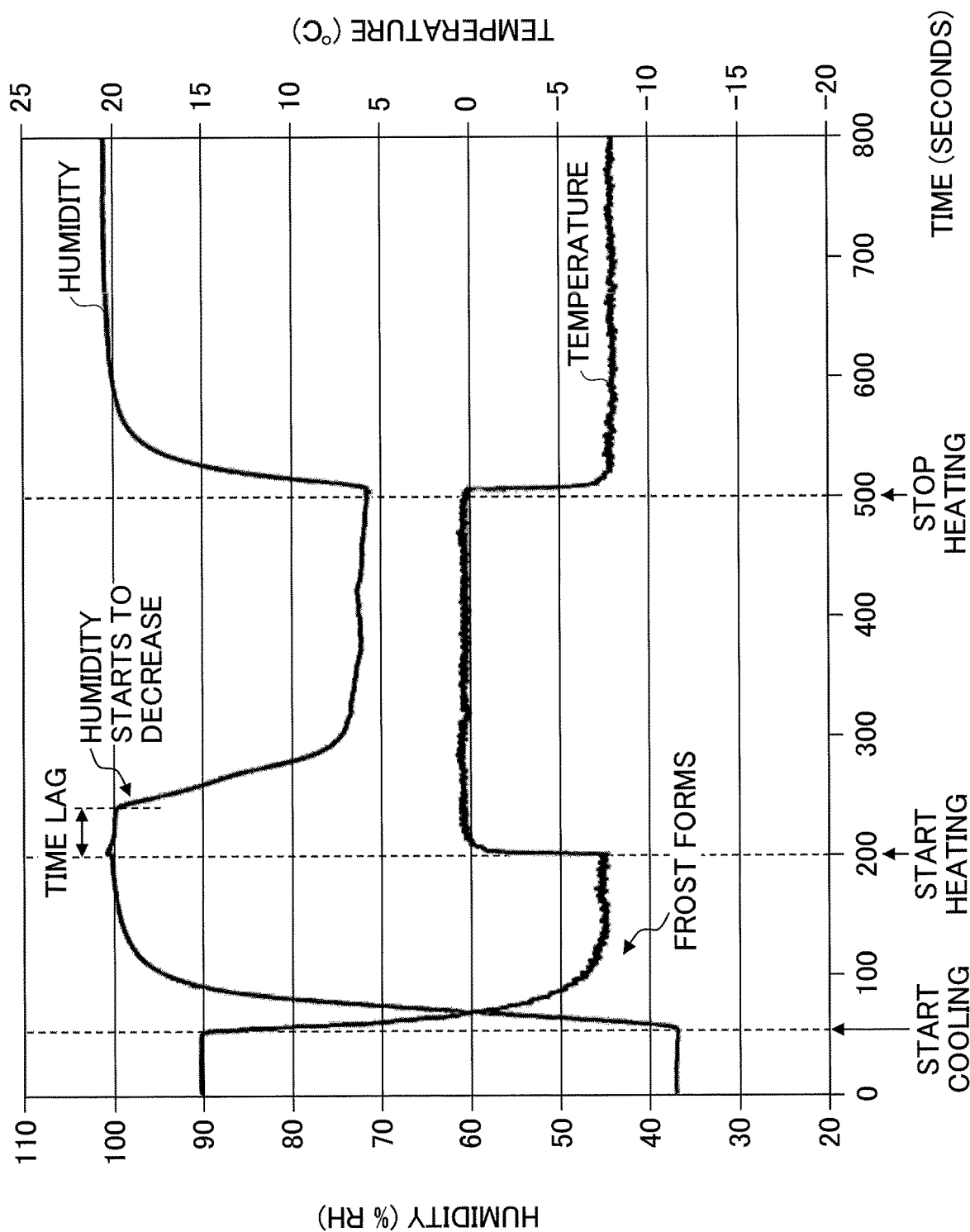
FIG. 33 is a graph illustrating the results of an experiment according to the second embodiment of the present invention.

FIG. 33 is a graph illustrating the results of the experiment according to the second embodiment of the present invention.

This experiment was performed in an environment at a temperature of 15° C. and a relative humidity of 35%. In this environment, the dew point was −0.323° C. and the frost point was −0.273° C.

As illustrated in FIG. 33, cooling was started by the Peltier element 50 seconds after the start of the experiment. Then, the temperature dropped to −8° C. and the formation of frost was observed during a period of 200 seconds after the start of the experiment.

Next, at 200 seconds after the start of the experiment, the heater 23 was turned on to start heating. There was a time lag of approximately 20 seconds from the start of a rapid increase in temperature until the start of a decrease in humidity.

Accordingly, it was verified that frost can be detected by utilizing the fact that a decrease in humidity is delayed when frost has formed.

Third Embodiment

In the following, a third embodiment will be described with reference to the accompanying drawings. The third embodiment differs from the first embodiment in that moisture detection is continued and a log of detection results is output. In the following third embodiment, only differences from the first embodiment will be described. Elements having the same functional configurations as the first embodiment are referred to by the same reference numerals used in the first embodiment, and thus a description thereof will be omitted.

Figure 34:
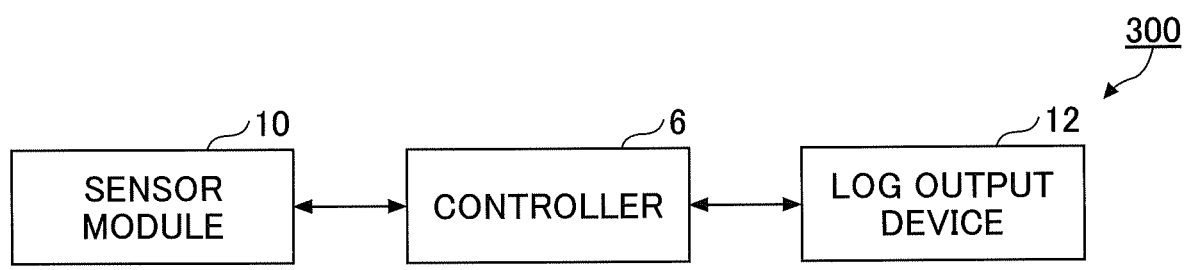
FIG. 34 is a schematic view of the overall configuration of a log output system according to a third embodiment of the present invention.

FIG. 34 is a schematic view of the overall configuration of a log output system according to the third embodiment of the present invention.

A log output system 300 continues to detect moisture and outputs a log of detection results. For example, the log output system 300 is used to monitor whether there is moisture adhering to vegetables grown in a polytunnel.

Specifically, the log output system 300 includes a sensor module 10, a controller 6, and a log output device 12.

As in the first embodiment, the sensor module 10 according to the third embodiment measures humidity and temperature.

As in the first embodiment, the controller according to the third embodiment receives measurement results from the sensor module 10, and determines whether moisture has formed.

The log output device 12 receives a determination result and measurement data from the controller 6, and outputs log data including the received determination result and measurement data to an output unit such as a display.

Figure 35:
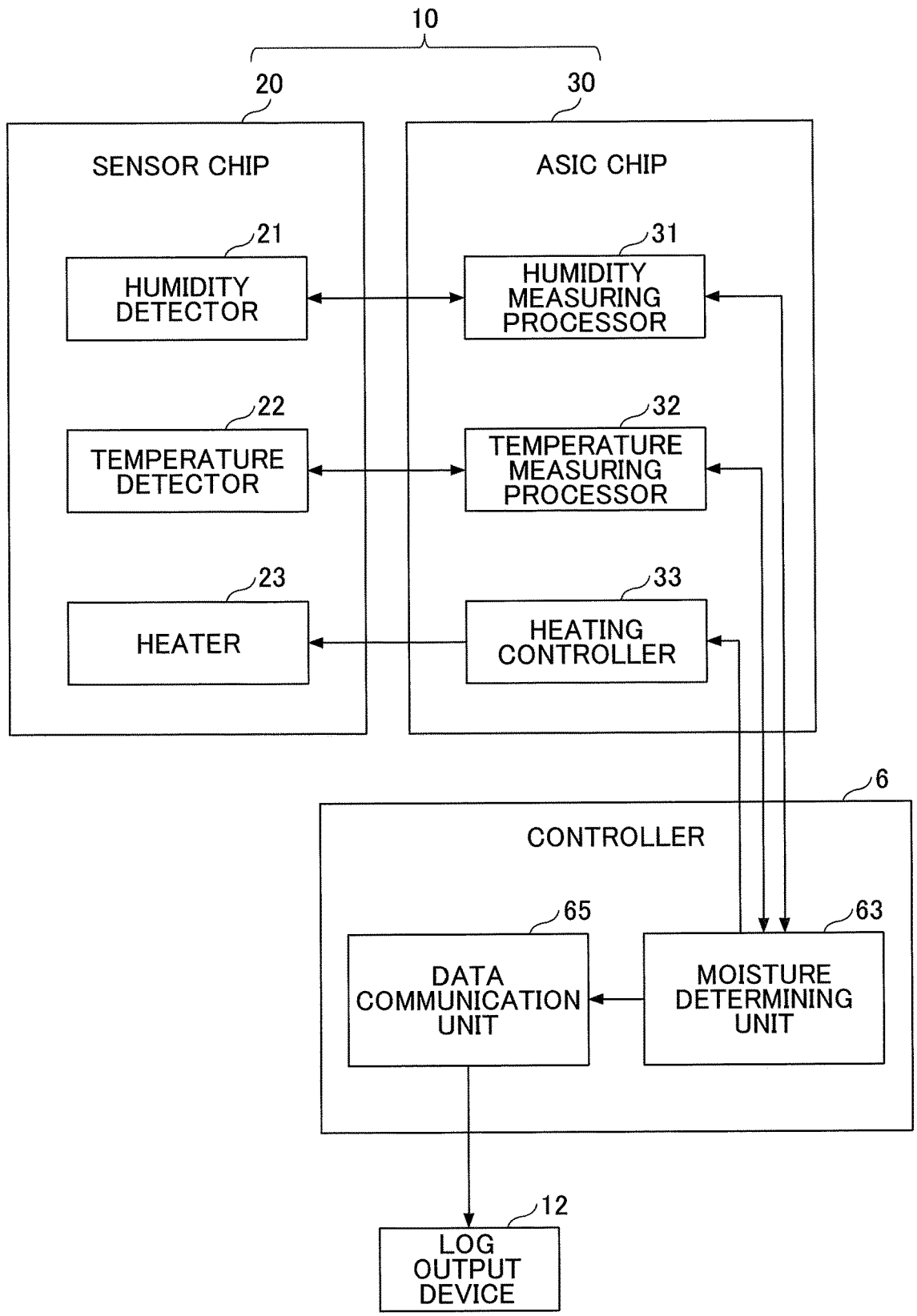
FIG. 35 is a block diagram illustrating a functional configuration of a sensor module and a controller according to the third embodiment of the present invention.

FIG. 35 is a block diagram illustrating a functional configuration of the sensor module and the controller according to the third embodiment of the present invention.

The controller 6 according to the third embodiment includes a moisture determining unit 63 and a data communication unit 65.

The data communication unit 65 transmits log data, including a determination result obtained from the moisture determining unit 63 and measurement results received from the sensor module 10, to the log output device 12. In addition, the data communication unit 65 receives a signal indicating the start or the end of a log output process, data indicating the current time, and any other data from the log output device 12.

Figure 36:
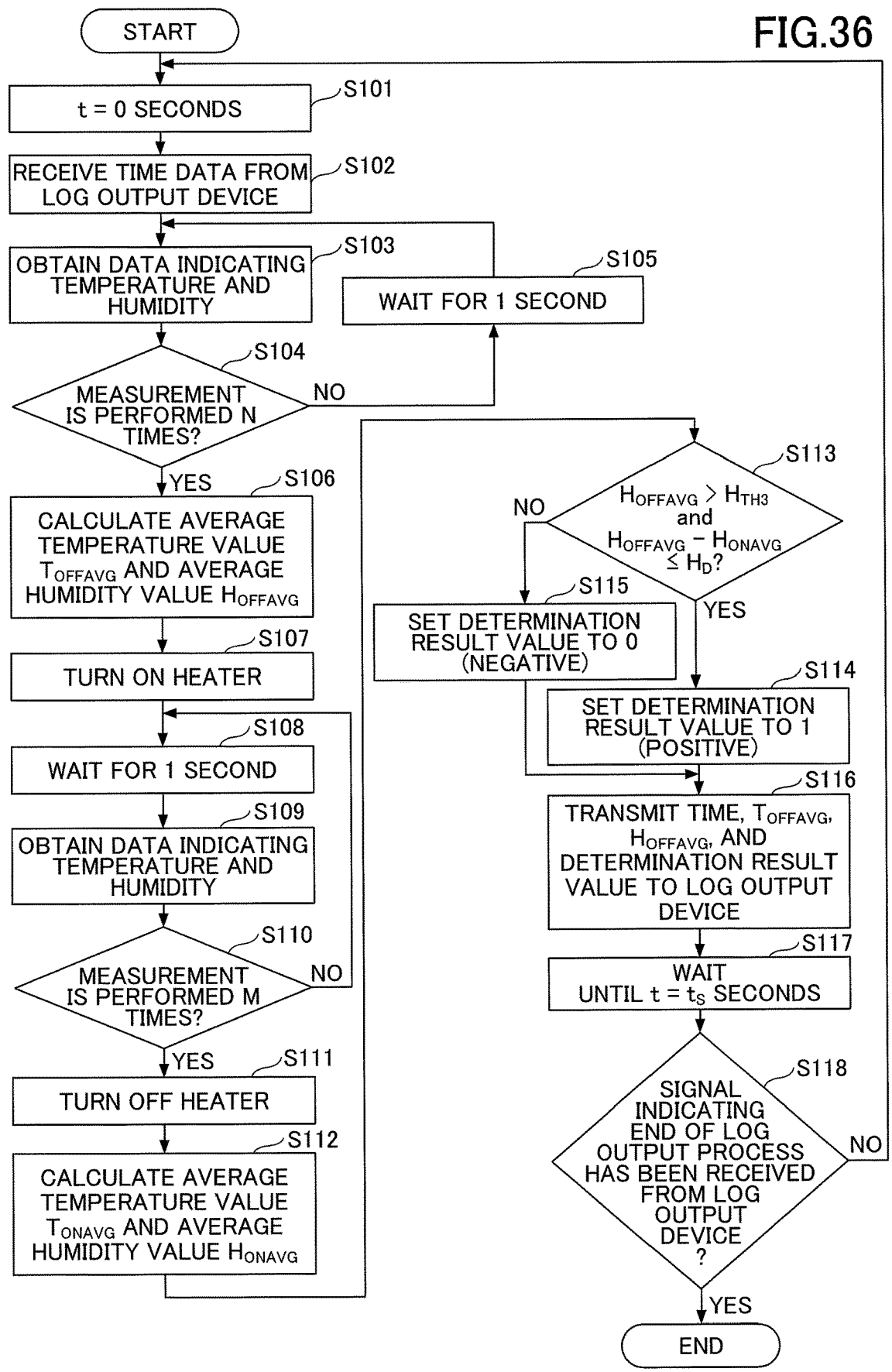
FIG. 36 is a flowchart illustrating a log output process according to the third embodiment of the present invention.

FIG. 36 is a flowchart illustrating the log output process according to the third embodiment of the present invention.

When the data communication unit 65 of the controller 6 receives a signal indicating the start of the log output process from the log output device 12, the controller 6 starts the log output process illustrated in FIG. 36.

The moisture determining unit 63 sets a time variable t to "0 seconds" (step S101). Note that the time variable t is a variable representing an elapsed time after the initial setting in step S101.

The moisture determining unit 63 receives time data indicating the current time from the log output device 12 (step S102).

Next, the moisture determining unit 63 obtains data indicating temperature and humidity. Specifically, the moisture determining unit 63 receives data indicating the humidity measured on the detection surface by the humidity measuring processor 31 and data indicating the temperature measured by the temperature measuring processor 32.

Next, the moisture determining unit 63 determines whether the measurement of the temperature and humidity is performed N times (step S104). N is a value representing a predetermined reference number of times, and may be set to 8 considering the measurement environment, for example. When it is determined that the measurement is not performed N times (no in step S104), the moisture determining unit 63 waits for 1 second (step S105), and causes the process to return to step S103.

Conversely, when it is determined that the measurement is performed N times (yes in step S104), the moisture determining unit 63 calculates an average temperature value $T_{OFFAVG}$ and an average humidity value $H_{OFFAVG}$ based on results of the measurement performed N times (step S106).

Next, the moisture determining unit 63 turns on the heater 23 (step S107), and waits for one second (step S108). By waiting for one second after the heater 23 is turned on, an increase in temperature of the sensor chip 20 is made stable. If the temperature and humidity are measured before a temperature increase of the sensor chip 20 is made stable, measurement results would be inaccurate. Therefore, it is possible to improve detection accuracy by obtaining data after a temperature increase is made stable.

Next, the moisture determining unit 63 obtains data indicating temperature and humidity (step S109). The moisture determining unit 63 determines whether the measurement of the temperature and humidity has been performed M times (step S110). M is a value representing a predetermined reference number of times, and may be set to 2 considering the measurement environment, for example. When it is determined that the measurement has not been performed M times (no in step S110), the moisture determining unit 63 causes the process to return to step S108.

Conversely, when it is determined that the measurement has been performed M times (yes in step S110), the moisture determining unit 63 turns off the heater 23, and calculates an average temperature value $T_{ONAVG}$ and an average humidity value $H_{ONAVG}$ based on results of the measurement performed M times (step S112).

Next, the moisture determining unit 63 determines whether $H_{OFFAVG} > H_{TH3}$, and determines whether $H_{OFFAVG} - H_{ONAVG} \leq H_D$ (step S113). $H_{TH3}$ and $H_D$ are preset thresholds. $H_{TH3}$ may be set to 90% RH, and $H_D$ may be set to 1.

If there is moisture such as condensation or frost adhering on the sensor chip 2, because a decrease in humidity is delayed, a value of $H_{OFFAVG} - H_{ONAVG}$ becomes small. Accordingly, it is possible to determine whether moisture has formed on the sensor chip 20 by determining whether $H_{OFFAVG} - H_{ONAVG} \leq H_D$.

In addition, moisture such as condensation or frost adheres to the sensor chip 20 in a high humidity environment. Therefore, it is possible to additionally determine whether an environment is prone to the formation of moisture by determining whether $H_{OFFAVG} > H_{TH3}$.

When it is determined that the inequalities $H_{OFFAVG} > H_{TH3}$ and $H_{OFFAVG} - H_{ONAVG} \leq H_D$ (yes in S113) hold, the moisture determining unit 63 sets a determination result value to 1 (positive) (step S114). The value 1 (positive) indicates that there is moisture such as condensation or frost adhering to the sensor chip 20.

When it is determined that the inequalities $H_{OFFAVG} > H_{TH3}$ and $H_{OFFAVG} - H_{ONAVG} \leq H_D$ do not hold (namely, inequalities $H_{OFFAVG} \leq H_{TH3}$ and $H_{OFFAVG} - H_{ONAVG} > H_D$ hold) (no S113), the moisture determining unit 63 sets a determination result value to 0 (negative) (step S115). The value 0 (negative) indicates that there is no moisture such as condensation or frost adhering to the sensor chip 20.

Next, the data communication unit 65 transmits data including the time data obtained in step S102, the average temperature value $T_{OFFAVG}$ and the average humidity value $H_{OFFAVG}$ calculated in step S106, and the determination result value determined in step S114 or step S115 to the log output device (step S116).

Next, the moisture determining unit 63 waits until the time variable $t=t_s$ (step S117). Herein, $t_s$ is a preset reference value, and may be set to 600 seconds considering the measurement environment, for example. The results of the experiment confirmed that the temperature and humidity of the sensor chip 20 returns to the ambient temperature and humidity in approximately 60 seconds after the heater 23 is turned off. Accordingly, $t_s$ may be set to approximately 60 seconds. In addition, functional blocks such as the data communication unit 65 and the moisture determining unit 63 required to be operated for moisture detection may be intermittently operated by being put in sleep mode until $t=t_s$, and being put back in active mode immediately before starting moisture detection. In this way, power consumption can be reduced.

The moisture determining unit 63 determines whether a signal indicating the end of the log output process has been received from the log output device 12 (step S118). Specifically, when a signal indicating the end of the log output process has been received from the log output device for a period of time from 0 seconds to $t_s$, the determination in step S118 is yes.

When the moisture determining unit 63 determines that the signal indicating the end of the log output process has not been received from the log output device 12 (no in S118), the process returns to step S101.

When the moisture determining unit 63 determines that the signal indicating the end of the log output process has been received from the log output device 12 (yes in S118), the log output process ends.

The log output device 12 displays a log on a display unit such as a display, based on the data received from the controller 6.

FIG. 37 is a table illustrating log output data according to the third embodiment.

A table 310 indicating log output data includes items "date and time", "temperature", "humidity", and "moisture determination result".

The values in the item "date and time" are values included in the time data received from the controller 6. Specifically, the values in the item "date and time" are values each indicating the date and time of a measurement. Strictly speaking, because multiple measurements are performed, the "date and time" indicates the start time of a measurement.

The values in the item "temperature" are average temperature values $T_{OFFAVG}$ received from the controller 6.

The values in the item "humidity" are average humidity values $H_{OFFAVG}$ received from the controller 6.

The values in the "moisture determination result" are determination result values received from the controller 6.

The log output system 300 according to the present embodiment continues to output a determination result of the presence or absence of moisture such as condensation or frost. Accordingly, the log output system 300 is useful, for example, in checking the results of humidity control carried out in a polytunnel at night.

Although specific embodiments have been described above, the present invention is not limited to the above-described embodiments. Variations and modifications may be made to the described subject matter without departing from the scope of the present invention. In the above-described embodiments, the moisture detector configured to detect moisture such as condensation forming in a crisper drawer and frost forming in a freezer compartment of a refrigerator has been described; however, the present invention is not limited thereto. The moisture detector according to the embodiments of the present invention may be employed to detect moisture such as condensation and frost in various electronic devices, such as HDDs, projectors, air conditioner cabinets, and window glass of vehicles.

What is claimed is:

1. A moisture detector comprising:
   a sensor chip including a humidity detector and a heater, the humidity detector having a detection surface on which to measure humidity, and the heater heating the detection surface; and
   a moisture determining unit configured to, after causing the heater to start heating, obtain the humidity, measured by the humidity detector, a plurality of times at predetermined time intervals, and determine that moisture is present on the detection surface in a case where an average value of the humidity obtained the plurality of times is greater than or equal to a threshold.

2. The moisture detector according to claim 1, wherein the sensor chip includes a temperature detector configured to measure a temperature, and
   the moisture determining unit decides, based on the temperature, whether presence or absence of condensation is to be determined or presence or absence of frost is to be determined.

3. The moisture detector according to claim 1, wherein the sensor chip includes a semiconductor substrate,
   the heater is formed by an impurity diffusion layer formed in the semiconductor substrate, and
   the humidity detector is configured by a lower electrode that is formed on the heater via an insulating film, a humidity sensing film that covers the lower electrode, and an upper electrode that is formed on the humidity sensing film.

4. The moisture detector according to claim 3, wherein the impurity diffusion layer has a one-dimensional grating pattern.

5. An electronic device comprising:
   the moisture detector according to claim 1;
   a sensor accommodating compartment in which the sensor chip is accommodated;
   a moisture remover;
   a driver configured to drive the moisture remover; and
   a controller configured to control the moisture determining unit and the driver,
   wherein the controller drives the moisture remover by controlling the driver in accordance with a determination result obtained from the moisture determining unit, and removes the moisture present in the sensor accommodating compartment.

6. A moisture detector comprising:
   a sensor chip including a humidity detector and a heater, the humidity detector having a detection surface on which to measure humidity, and the heater heating the detection surface; and
   a moisture determining unit configured to, after causing the heater to start heating, obtain the humidity, measured by the humidity detector, a plurality of times at predetermined time intervals, and determine that moisture is present on the detection surface in a case where a number of consecutive times a differential value becomes greater than or equal to a reference value is greater than or equal to a reference number of times, the differential value being calculated between readings of the humidity obtained at two consecutive times.

7. The moisture detector according to claim 6, wherein the moisture determining unit estimates an amount of the moisture present on the detection surface, based on the number of consecutive times the difference value becomes greater than or equal to the reference value.

8. The moisture detector according to claim 7, wherein the sensor chip includes a temperature detector configured to measure a temperature, and the moisture determining unit estimates the amount of the moisture, based on the number of consecutive times the difference value becomes greater than or equal to the reference value and also based on an amount of change in the temperature for a given period of time after the moisture determining unit causes the heater to start the heating.

9. The moisture detector according to claim 8, wherein the moisture determining unit estimates that the larger the number of consecutive times the difference value becomes greater than or equal to the reference value is, and also the smaller the amount of change in the temperature is, the larger the amount of the moisture becomes.

10. The moisture detector according to claim 7, further comprising a semiconductor chip configured to process a signal received from the sensor chip, and wherein the semiconductor chip includes a temperature detector configured to measure a temperature, and the moisture determining unit estimates the amount of the moisture, based on the number of consecutive times the difference value becomes greater than or equal to the reference value and also based on an amount of change in the temperature for a given period of time after the moisture determining unit causes the heater to start the heating.

11. The moisture detector according to claim 6, wherein the sensor chip includes a temperature detector configured to measure a temperature, and the moisture determining unit decides, based on the temperature, whether presence or absence of condensation is to be determined or presence or absence of frost is to be determined.

12. The moisture detector according to claim 6, wherein the sensor chip includes a semiconductor substrate, the heater is formed by an impurity diffusion layer formed in the semiconductor substrate, and the humidity detector is configured by a lower electrode that is formed on the heater via an insulating film, a humidity sensing film that covers the lower electrode, and an upper electrode that is formed on the humidity sensing film.

13. The moisture detector according to claim 12, wherein the impurity diffusion layer has a one-dimensional grating pattern.

14. An electronic device comprising:

the moisture detector according to claim 6;

a sensor accommodating compartment in which the sensor chip is accommodated;

a moisture remover;

a driver configured to drive the moisture remover; and a controller configured to control the moisture determining unit and the driver, wherein the controller drives the moisture remover by controlling the driver in accordance with a determination result obtained from the moisture determining unit, and removes the moisture present in the sensor accommodating compartment.

15. A moisture detection method using a sensor chip including a humidity detector and a heater, the humidity detector having a detection surface on which to measure humidity, and the heater heating the detection surface, causing the heater to start heating, and subsequently obtaining the humidity, measured by the humidity detector, a plurality of times at predetermined time intervals, and determining that moisture is present on the detection surface in a case where an average value of the humidity obtained the plurality of times is greater than or equal to a threshold.

\* \* \* \* \*